(12) United States Patent
Yang

(10) Patent No.: US 7,701,521 B2
(45) Date of Patent: Apr. 20, 2010

(54) ARRAY SUBSTRATE HAVING PARTICULAR STORAGE CAPACITANCE STRUCTURE FOR LIQUID CRYSTAL DISPLAY DEVICE AND METHOD OF MANUFACTURING THE SAME

(75) Inventor: Joon-Young Yang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 306 days.

(21) Appl. No.: 11/878,426

(22) Filed: Jul. 24, 2007

(65) Prior Publication Data

US 2007/0268419 A1 Nov. 22, 2007

Related U.S. Application Data

(62) Division of application No. 11/166,923, filed on Jun. 27, 2005, now Pat. No. 7,256,061.

(30) Foreign Application Priority Data

Aug. 3, 2004 (KR) ............... 10-2004-0061047

(51) Int. Cl.
*G02F 1/1343* (2006.01)
*G02F 1/136* (2006.01)
(52) U.S. Cl. .............. 349/39; 349/38; 349/42; 349/43; 349/47; 349/147
(58) Field of Classification Search .......... 349/38, 349/39, 42, 43, 47
See application file for complete search history.

(56) References Cited

U.S. PATENT DOCUMENTS

| | | | |
|---|---|---|---|
| 6,403,409 B1 | 6/2002 | You | |
| 6,593,592 B1 * | 7/2003 | Yamazaki et al. | 257/71 |
| 6,617,203 B2 | 9/2003 | Kim et al. | |
| 6,753,235 B2 | 6/2004 | So et al. | |
| 2001/0003657 A1 | 6/2001 | Lee | |
| 2003/0128178 A1 * | 7/2003 | Murade | 345/87 |
| 2005/0133791 A1 | 6/2005 | Yang | |
| 2005/0243230 A1 | 11/2005 | Chen | |
| 2006/0231846 A1 | 10/2006 | Hong et al. | |
| 2007/0040178 A1 | 2/2007 | Chang et al. | |
| 2007/0051955 A1 | 3/2007 | Yoo et al. | |

\* cited by examiner

*Primary Examiner*—Michael H Caley
(74) *Attorney, Agent, or Firm*—McKenna Long & Aldridge LLP

(57) ABSTRACT

An array substrate for a liquid crystal display device includes a substrate including a first driving region, a second driving region, and a pixel region, the pixel region including a switching region and a storage region; a first n-type transistor in the first driving region, a second p-type transistor in the second driving region; a third transistor in the switching region, the third transistor including a gate electrode, an active layer, a source electrode, and a drain electrode; an extension portion in the storage region and extending from the active layer; a metal pattern on the extension portion; a storage line over the metal pattern; and a pixel electrode in the pixel region and contacting the third transistor, wherein the metal pattern, the storage line and the pixel electrode form first, second and third electrodes of a storage capacitor that includes a first capacitor and a second capacitor parallel to each other.

7 Claims, 57 Drawing Sheets

ARRAY SUBSTRATE HAVING PARTICULAR STORAGE CAPACITANCE STRUCTURE FOR LIQUID CRYSTAL DISPLAY DEVICE AND METHOD OF MANUFACTURING THE SAME

This application is a divisional of application Ser. No. 11/166,923, filed Jun. 27, 2005 now U.S. Pat. No. 7,256,061, which claims priority to Korean Patent Application No. 10-2004-0061047, filed Aug. 3, 2004, each of which are incorporated by reference for all purposes as if fully set forth herein.

This application claims the benefit of Korean Patent Application No. 2004-0061047 filed in Korea on Aug. 3, 2004, which is hereby incorporated by reference in its entirety.

BACKGROUND OF THE INVENTION

1. Field of the Invention

The present invention relates to a liquid crystal display device and more particularly, to an array substrate for a liquid crystal display device and a method of manufacturing the same.

2. Discussion of the Related Art

A liquid crystal display (LCD) device includes an upper substrate, a lower substrate and a liquid crystal layer disposed between the upper and lower substrates. The LCD device uses an optical anisotropy of liquid crystal to produce an image. An electric field is used to control the light transmittance of the liquid crystal layer by varying the arrangement of liquid crystal molecules.

One substrate of the LCD device includes a thin film transistor that acts as a switching element. An LCD device, which includes the thin film transistor, is referred to as an active matrix liquid crystal display (AMLCD) device and it has a high resolution and can display an excellent moving image. Hydrogenated amorphous silicon (a-Si:H) is widely used as an active layer of the thin film transistor because the hydrogenated amorphous silicon can be formed on a large, low cost substrate such as glass.

However, the hydrogenated amorphous silicon includes weak Si—Si bonds and dangling bonds due to disordered atomic arrangement. Thus, when light or an electric field is applied, there may be stability problems in the hydrogenated amorphous silicon used as the active layer of the thin film transistor. Additionally, the thin film transistor including the hydrogenated amorphous silicon has a low field effect mobility of about 0.1 to 1.0 cm$^2$/V·s and is difficult to be used for a driver integrated circuit (driver IC) that controls the thin film transistor. The driver IC usually includes CMOS (complementary metal-oxide-semiconductor) transistors that require crystalline silicon as active layers. Because of this, the driver IC is usually connected to the array substrate using a TAB (tape automated bonding) system. This adds significant cost to the LCD device.

To avoid the limitations of amorphous silicon, LCD devices incorporating polycrystalline silicon as an active layer are being researched and developed. Polycrystalline silicon is highly beneficial because it is much better suited for use in the driver IC than amorphous silicon. Thus, polycrystalline silicon has the advantage that the number of fabrication steps could be reduced because a thin film transistor and a driver IC could be formed on the same substrate, eliminating the need for TAB bonding. Furthermore, the field effect mobility of polycrystalline silicon is 100 to 200 times greater than that of amorphous silicon. Polycrystalline silicon is also optically and thermally stable.

FIG. 1 is a schematic view showing an array substrate of a liquid crystal display device having driver integrated circuits (driver ICs) according to the related art. Referring to FIG. 1, the array substrate includes a display region D1 and a non-display region D2 on an insulating substrate 10. In the display region D1, gate lines GL are formed along a first direction, and data lines DL are formed along a second direction perpendicular to the first direction. The gate lines GL and the data lines DL cross each other to define pixel regions P. The pixel regions P form a matrix. In each pixel region P, a switching element T and a pixel electrode 78, which is connected to the switching element T, are formed. In the non-display region D2, gate and data driving portions GP and DP are disposed. The gate driving portion GP is disposed in the left region of the substrate 10 in the context of the figure, and the data driving portion DP is disposed in the top region of the substrate 10 in the context of the figure. The gate driving portion GP, which includes a plurality of driver ICs, supplies an address signal to the gate lines GL, and the data driving portion DP, which also includes a plurality of driver ICs, supplies an image signal to the data lines DL.

The gate driving portion GP and the data driving portion DP are electrically connected to an outer control circuit (not shown) with signal input terminals OL which are formed on one edge of the substrate 10, so that the outer control circuit (not shown) controls the driver ICs of the gate driving portion GP and the data driving portion DP. The outer control circuit (not shown) applies signals to the gate and data driving portions GP and DP through the signal input terminals OL.

The gate driving portion GP and the data driving portion DP include driver ICs having a CMOS (complementary metal-oxide-semiconductor) transistor as an inverter which changes a direct current into an alternating current. The CMOS transistor comprises an n-channel MOS transistor (or n-type MOS transistor), in which electrons are the majority carriers, and a p-channel MOS transistor (or p-type MOS transistor), in which holes are the majority carriers. Therefore, in an n-channel MOS transistor, most of the current is carried by negatively charged electrons, and in a p-channel MOS transistor, most of the conduction is carried by positively charged holes. The thin film transistor T of the display region D1 and the CMOS transistor (not shown) of the non-display region D2 may use polycrystalline silicon as an active layer, and thus can be formed on the same substrate 10.

FIG. 2 is a plan view illustrating a pixel region of an array substrate including a polycrystalline silicon thin film transistor according to the related art. Referring to FIG. 2, a gate line GL is formed along a direction on a substrate 10, and a data line DL crosses the gate line GL to define a pixel region P. A thin film transistor T is formed at the crossing portion of the gate and data lines GL and DL. The thin film transistor T includes an active layer 18 of polycrystalline silicon, a gate electrode 34 over the active layer 18, and source and drain electrodes 70 and 72 contacting the active layer 18. A pixel electrode 78 is formed in the pixel region P and is connected to the drain electrode 72. A storage capacitor $C_{ST}$ is also formed in the pixel region P. The storage capacitor $C_{ST}$ includes an impurity-doped polycrystalline silicon pattern 20, as a first electrode, and a storage line 36, as a second electrode. The storage line 36 is disposed over the impurity-doped polycrystalline silicon pattern 20 and traverses the pixel region P.

FIGS. 3A and 3B are cross-sectional views of an array substrate including driver ICs according to the related art. FIG. 3A illustrates a CMOS transistor in a driving region, and FIG. 3B illustrates a pixel region including a switching element. FIG. 3B corresponds to a cross-section taken along the line III-III of FIG. 2. Referring to FIGS. 3A and 3B, a buffer layer 12 is formed on a substrate 10. A CMOS transistor is formed in a driving region including a first driving region A and a second driving region B. The CMOS transistor is composed of an n-type MOS transistor and a p-type MOS transistor in the first and second driving regions A and B, respectively. An n-type thin film transistor, as a switching element, is formed in a switching region C of a pixel region P, and a storage capacitor $C_{ST}$ is formed in a storage region ST of the pixel region P. A pixel electrode 78 is also formed in the pixel region P and is connected to the n-type thin film transistor.

More particularly, first, second and third active patterns 14, 16 and 18 are formed in the first driving region A, the second driving region B and the switching region C, respectively. Each of the first, second and third active patterns 14, 16 and 18 is formed of polycrystalline silicon and includes an intrinsic portion V1 and doped portions V2. The first and third active patterns 14 and 18 include a lightly doped drain (LDD) portion F between the intrinsic portion V1 and each doped portion V2. The LDD portion F includes impurities of low density and prevents leakage current of an off-state, that is, applying reverse bias to a thin film transistor. An extension portion 20 extends from the third active pattern 18 into the pixel region P.

A gate insulating layer 28 is formed on the entire surface of the substrate 10 including the first, second and third active patterns 14, 16 and 18. First, second and third gate electrodes 30, 32 and 34 are formed on the gate insulating layer 28. The first, second and third gate electrodes 30, 32 and 34 correspond to the intrinsic portions of the first, second and third active patterns 14, 16 and 18, respectively. A storage line 36 traversing the pixel region P is also formed on the gate insulating layer 38. The storage line 36 is disposed over the extension portion 20. The extension portion 20 and the storage line 36 function as a first electrode and a second electrode, respectively, to form the storage capacitor $C_{ST}$. An inter insulating layer 48 is formed on the entire surface of the substrate 10 including the first, second and third gate electrodes 30, 32 and 34 and the storage line 36. The inter insulating layer 48 and the gate insulating layer 28 include contact holes exposing the doped portions of the first, second and third active patterns 14, 16 and 18.

First source and drain electrodes 62 and 64, second source and drain electrodes 66 and 68, and third source and drain electrodes 70 and 72 are formed on the inter insulating layer 48. The first source and drain electrodes 62 and 64 contact the exposed doped portions V2 of the first active pattern 14, the second source and drain electrodes 66 and 68 contact the exposed doped portions V2 of the second active pattern 16, and the third source and drain electrodes 70 and 72 contact the exposed doped portions V2 of the third active pattern 18. A pixel electrode 78 is formed on a passivation layer 74 in the pixel region P and is connected to the third drain electrode 72 in the switching region C. As stated above, the n-type thin film transistor in the switching region C and the CMOS transistor in the driving region are formed on the same substrate through the same processes.

A manufacturing method of an array substrate including driver ICs according to the related art will be explained hereinafter with reference to attached drawings.

FIGS. 4A and 4B to FIGS. 12A and 12B are cross-sectional views illustrating a manufacturing method of an array substrate including driver ICs according to the related art. FIGS. 4B to 12B illustrate a pixel region including a switching element and correspond to cross-sections taken along the line III-III of FIG. 2. Referring to FIGS. 4A and 4B, a driving region, which includes a first driving region A and a second driving region B, and a pixel region P, which includes a switching region C and a storage region ST, are defined on a substrate 10. A buffer layer 12 is formed on the substrate 10 by depositing silicon oxide ($SiO_2$).

First, second and third active patterns 14, 16 and 18 are formed on the buffer layer 12 in the first driving region A, the second driving region B and the switching region C, respectively, through a first mask process. The first, second and third active patterns 14, 16 and 18 are formed of polycrystalline silicon. Each of the first, second and third active patterns 14, 16 and 18 includes an intrinsic portion V1 and doped portions V2. The first and third active patterns 14 and 18 further include a lightly doped drain (LDD) portion F between the intrinsic portion V1 and each doped portion V2. An extension portion 20 is also formed on the buffer layer 12 in the storage region ST. The extension portion 20 extends from the third active pattern 18.

In FIGS. 5A and 5B, first, second and third photoresist patterns 22, 24 and 26 are formed on the first, second and third active patterns 14, 16 and 18, respectively, by coating a photoresist material on the entire surface of the substrate 10 and then patterning the photoresist material through a second mask process. The extension portion 20 is not covered with the photoresist patterns 22, 24 and 26 and is exposed. Next, $n^+$ or $p^+$ ion doping is performed in the exposed extension portion 20. The doped extension portion 20 functions as an electrode for a storage capacitor. The first, second and third photoresist patterns 22, 24 and 26 are removed.

In FIGS. 6A and 6B, a gate insulating layer 28 is formed on the substrate 10 including the doped extension portion 20 by depositing an inorganic insulating material such as silicon nitride ($SiN_X$) or silicon oxide ($SiO_2$). First, second and third gate electrodes 30, 32 and 34 are formed on the gate insulating layer 28 by sequentially depositing and then patterning aluminum (Al) or an aluminum alloy such as AlNd through a third mask process. The first, second and third gate electrodes 30, 32 and 34 correspond to the intrinsic portions of the first, second and third active patterns 14, 16 and 18, respectively. A storage line 36 is also formed on the gate insulating layer 28 over the extension portion 20 in the storage region ST. The extension portion 20 and the storage line 36 form a storage capacitor $C_{ST}$ and function as first and second electrodes of the storage capacitor $C_{ST}$, respectively. Subsequently, $n^-$ ion doping, in which n-type impurities are lightly doped, is carried out on the entire surface of the substrate 10 including the first, second and third gate electrodes 30, 32 and 34. Thus, n-type ions are lightly doped in the LDD portions F of the first and third active patterns 14 and 18 and the doped portions V2 of the first, second and third active patterns 14, 16 and 18.

In FIGS. 7A and 7B, a photoresist material is coated on the entire surface of the substrate 10 where $n^-$ ion doping is performed and then is patterned through a fourth mask process, to thereby form fourth, fifth and sixth photoresist patterns 38, 40 and 42. The fourth photoresist pattern 38 covers the first gate electrode 30 and the LDD portions F of the first active pattern 14. The fifth photoresist pattern 40 covers the second gate electrode 32 and the second active pattern 16. The sixth photoresist pattern 42 covers the third gate electrode 34 and the LDD portions F of the third active pattern 18. Here, the doped portions V2 of the first and third active patterns 14 and 18 are exposed. Next, $n^+$ ion doping is performed on the entire surface of the substrate 10 including the fourth, fifth and sixth photoresist patterns 38, 40 and 42. Therefore, n-type ions are heavily doped in the doped portions V2 of the first and third active patterns 14 and 18. The fourth, fifth and sixth photoresist patterns 38, 40 and 42 are then removed.

In FIGS. 8A and 8B, a photoresist material is coated on the substrate 10 where n+ ion doping is performed. Then, the photoresist material is patterned through a fifth mask process, to thereby form seventh and eighth photoresist patterns 44 and 46. The seventh photoresist pattern 44 covers the first gate electrode 30 and the first active pattern 14, and the eighth photoresist pattern 46 covers the third gate electrode 34 and the third active pattern 18. The eighth photoresist pattern 46 also covers the storage line 36. Subsequently, p+ ion doping is performed on the entire surface of the substrate 10 including the seventh and eighth photoresist patterns 44 and 46, and p-type ions are heavily doped in the doped portions V2 of the second active pattern 16. The seventh and eighth photoresist patterns 44 and 46 are then removed.

In FIGS. 9A and 9B, an inter insulating layer 48 is formed on the entire surface of the substrate 10 where p+ ion doping is performed. The inter insulating layer 48 is patterned through a sixth mask process to form first, second, third, fourth, fifth and sixth contact holes 50, 52, 54, 56, 58 and 60. The first and second contact holes 50 and 52 expose the doped portions V2 of the first active pattern 14, the third and fourth contact holes 54 and 56 expose the doped portions V2 of the second active pattern 16, and the fifth and sixth contact holes 58 and 60 expose the doped portions V2 of the third active pattern 18. The inter insulating layer 48 is formed of silicon oxide ($SiO_2$).

In FIGS. 10A and 10B, first source and drain electrodes 62 and 64, second source and drain electrodes 66 and 68, and third source and drain electrodes 70 and 72 are formed the inter insulating layer 48 by sequentially depositing and then patterning, a metallic material mentioned above through a seventh mask process. The first source and drain electrodes 62 and 64 contact the doped portions V2 of the first active pattern 14 through the first and second contact holes 50 and 52. The second source and drain electrodes 66 and 68 contact the doped portions V2 of the second active pattern 16 through the third and fourth contact holes 54 and 56. The third source and drain electrodes 70 and 72 contact the doped portions V2 of the third active pattern 18 through the fifth and sixth contact holes 58 and 60.

In FIGS. 11A and 11B, a passivation layer 74 is formed on the entire surface of the substrate 10 including the source electrodes 62, 66 and 70 and the drain electrodes 64, 68 and 72 thereon. The passivation layer 74 is patterned through an eighth mask process to thereby form a drain contact hole 76. The drain contact hole 76 exposes the third drain electrode 72 in the switching region C.

In FIGS. 12A and 12B, a pixel electrode 78 is formed on the passivation layer 74 in the pixel region P by sequentially depositing and patterning a transparent conductive material through a ninth mask process. The pixel electrode 78 contacts the third drain electrode 72 through the drain contact hole 76.

The array substrate of the related art may be fabricated through the above-mentioned mask processes. However, problems may frequently occur because the related art array substrate is fabricated through a large number of mask processes, each mask process including several steps, such as cleaning, coating a photoresist layer, exposing through a mask, developing the photoresist layer, and etching. In addition, manufacturing time and costs are increased, and productivity of the processes is lowered.

SUMMARY OF THE INVENTION

Accordingly, the present invention is directed to an array substrate for a liquid crystal display device and a method of manufacturing the same that substantially obviates one or more of problems due to limitations and disadvantages of the related art.

An object of the present invention is to provide an array substrate having driver integrated circuits and a method of manufacturing the same at a low cost.

Another object of the present invention is to provide an array substrate having driver integrated circuits and a method of manufacturing the same using reduced number of processes.

Another object of the present invention is to provide an array substrate having driver integrated circuits and a method of manufacturing the same that increase productivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes a substrate including a first driving region, a second driving region, and a pixel region, the pixel region including a switching region and a storage region; a first n-type transistor in the first driving region, a second p-type transistor in the second driving region; a third transistor in the switching region, the third transistor including a gate electrode, an active layer, a source electrode, and a drain electrode; an extension portion in the storage region and extending from the active layer; a metal pattern on the extension portion; a storage line over the metal pattern; and a pixel electrode in the pixel region and contacting the third transistor, wherein the metal pattern, the storage line and the pixel electrode form first, second and third electrodes of a storage capacitor, and wherein the storage capacitor includes a first capacitor and a second capacitor, the first capacitor parallel to the second capacitor.

In another aspect, a method of manufacturing a liquid crystal display device includes forming first, second and third active patterns, an extension portion and a metal pattern on a substrate using a first mask, the substrate having a driving region and a pixel region, the first and second active patterns disposed in first and second driving regions of the driving region, the third active pattern disposed in a switching region of the pixel region, and the extension portion and the metal pattern disposed in a storage region of the pixel region; forming a gate insulating layer on the substrate including the first, second and third active patterns, the extension portion and the metal pattern; forming first, second and third gate electrodes and a storage line on the gate insulating layer using a second mask, the first, second and third gate electrodes corresponding to center portions of the first, second and third active patterns, and the storage line disposed over the metal pattern; sequentially doping n+ ions and n− ions in the first and third active patterns using a third mask; doping p+ ions into the second active pattern using a fourth mask; forming an inter insulating layer and a transparent conductive layer on the substrate including the p+ ion doped second active pattern; patterning the inter insulating layer and the transparent conductive layer using a fifth mask to thereby expose portions of the first, second and third active patterns and to form a pixel electrode in the pixel region; and forming first source and drain electrodes, second source and drain electrodes and third source and drain electrodes using a sixth mask, the first source and drain electrodes contacting the exposed portions of the first active pattern, the second source and drain electrodes contacting the exposed portions of the second active pattern, and the third source and drain electrodes contacting the exposed portions of the third active pattern.

In another aspect, a method of manufacturing a liquid crystal display device includes forming first, second and third active patterns, an extension portion and a metal pattern on a substrate using a first mask, the substrate having a first driving region, a second driving region, and a pixel region including a switching region and a storage region, the first and second active patterns disposed in the first and second driving regions, the third active pattern disposed in the switching region, and the extension portion and the metal pattern disposed in the storage region; forming a gate insulating layer on the substrate including the first, second and third active patterns, the extension portion and the metal pattern; doping $n^+$ ions and $n^-$ ions in the first and third active patterns and then forming first, second and third gate electrodes and a storage line on the gate insulating layer using a second mask, the first, second and third gate electrodes corresponding to center portions of the first, second and third active patterns, the storage line disposed over the metal pattern; doping $p^+$ ions into the second active pattern using a third mask; forming an inter insulating layer and a transparent conductive layer on the substrate including the $p^+$ ion doped second active pattern; patterning the inter insulating layer and the transparent conductive layer using a fourth mask to expose portions of the first, second and third active patterns and to form a pixel electrode in the pixel region; and forming first source and drain electrodes, second source and drain electrodes, and third source and drain electrodes using a fifth mask, the first source and drain electrodes contacting the exposed portions of the first active pattern, the second source and drain electrodes contacting the exposed portions of the second active pattern, the third source and drain electrodes contacting the exposed portions of the third active pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 4A and 4B to FIGS. 12A and 12B are cross-sectional views illustrating a manufacturing method of an array substrate including driver ICs according to the related art.

FIGS. 28A and 28B to FIGS. 41A and 41B are cross-sectional views illustrating a manufacturing method of an array substrate including driver ICs according to another embodiment of the present invention.

DETAILED DESCRIPTION OF THE ILLUSTRATED EMBODIMENTS

Reference will now be made in detail to the illustrated exemplary embodiments of the present invention, which are illustrated in the accompanying drawings.

Figure 1:
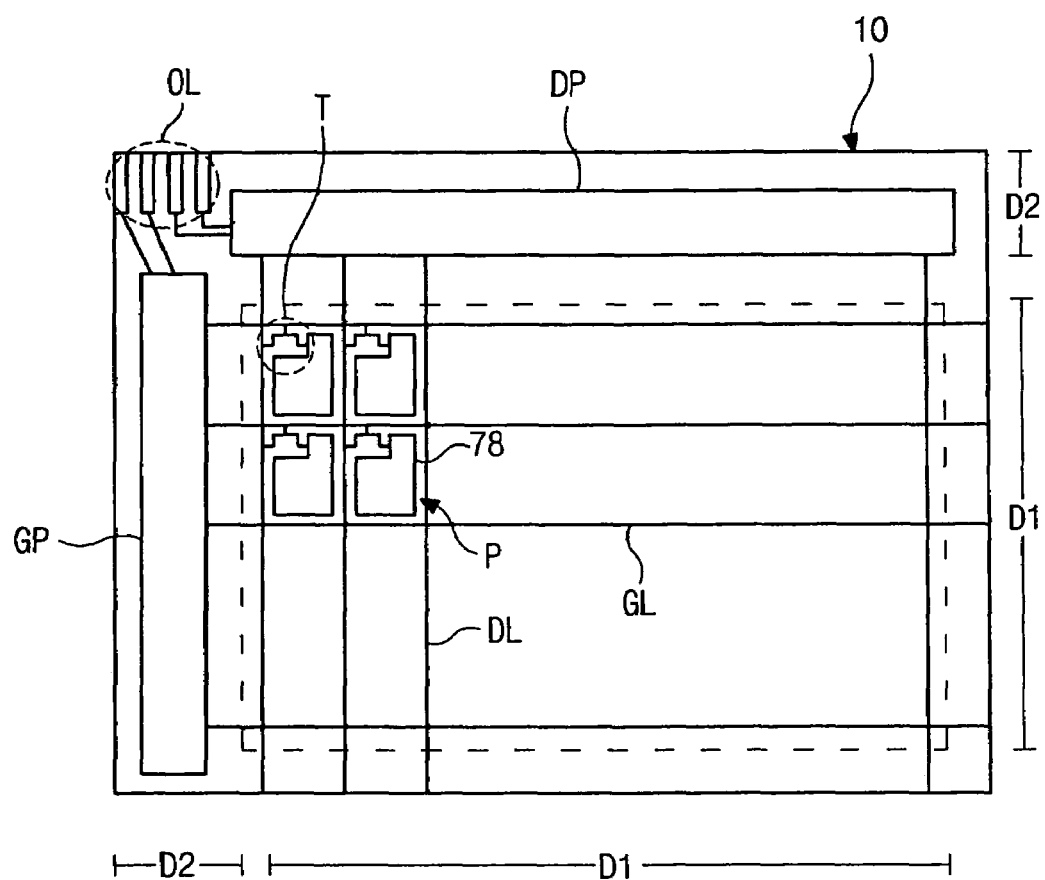
FIG. 1 is a schematic view showing an array substrate of a liquid crystal display device having driver integrated circuits according to the related art.
Figure 2:
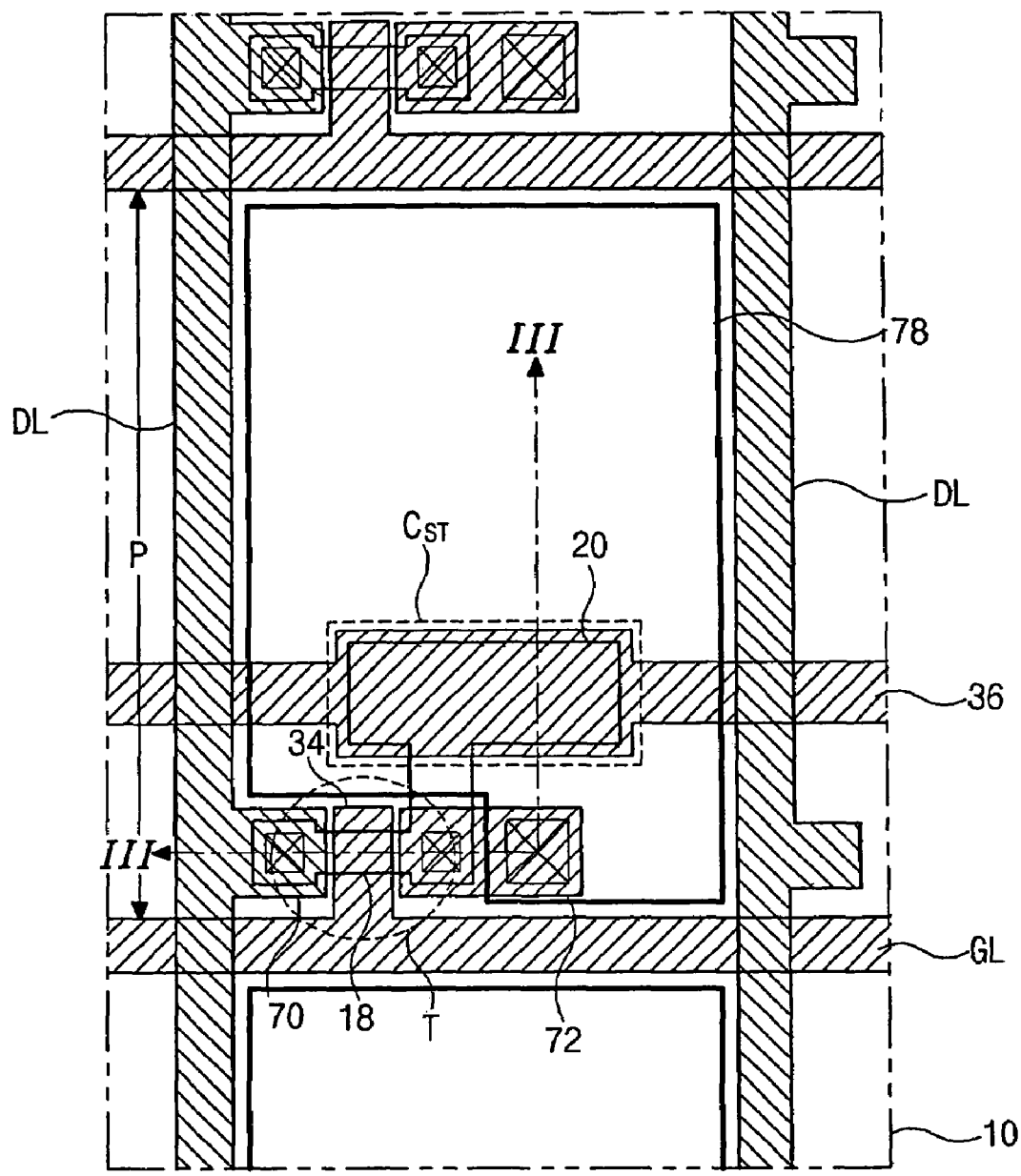
FIG. 2 is a plan view illustrating a pixel region of an array substrate including a polycrystalline silicon thin film transistor according to the related art.
Figure 3A:
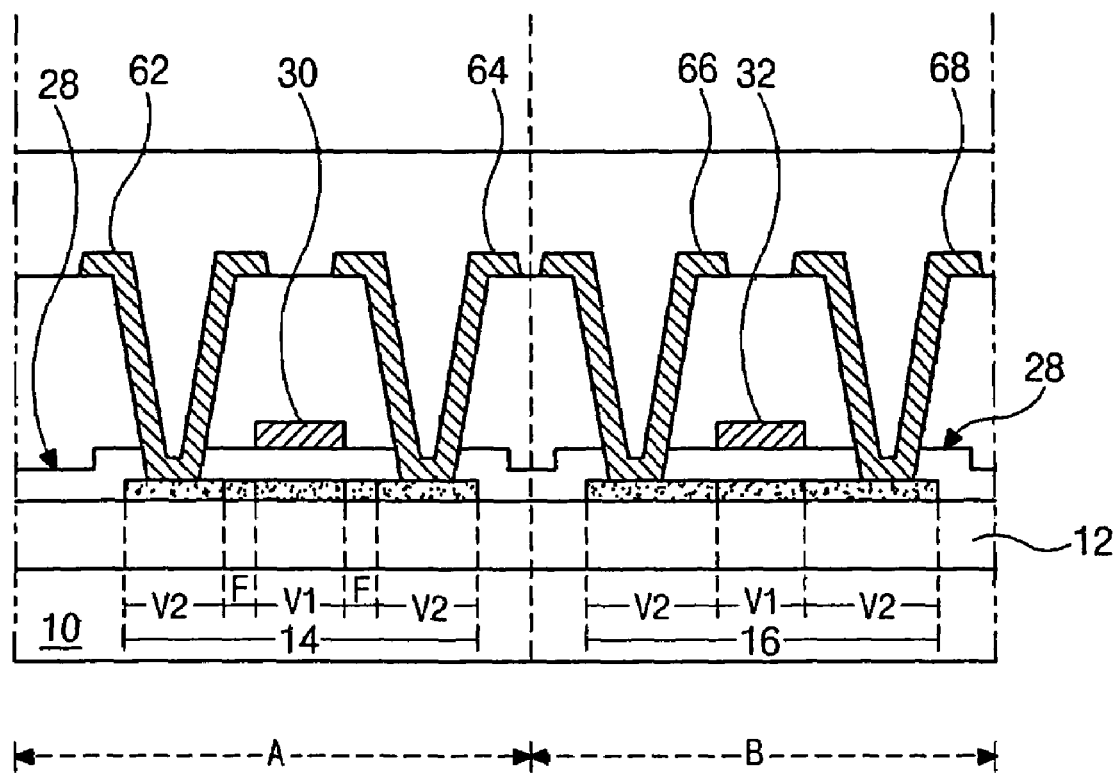
FIGS. 3A and 3B are cross-sectional views of an array substrate including driver ICs according to the related art.
Figure 3B:
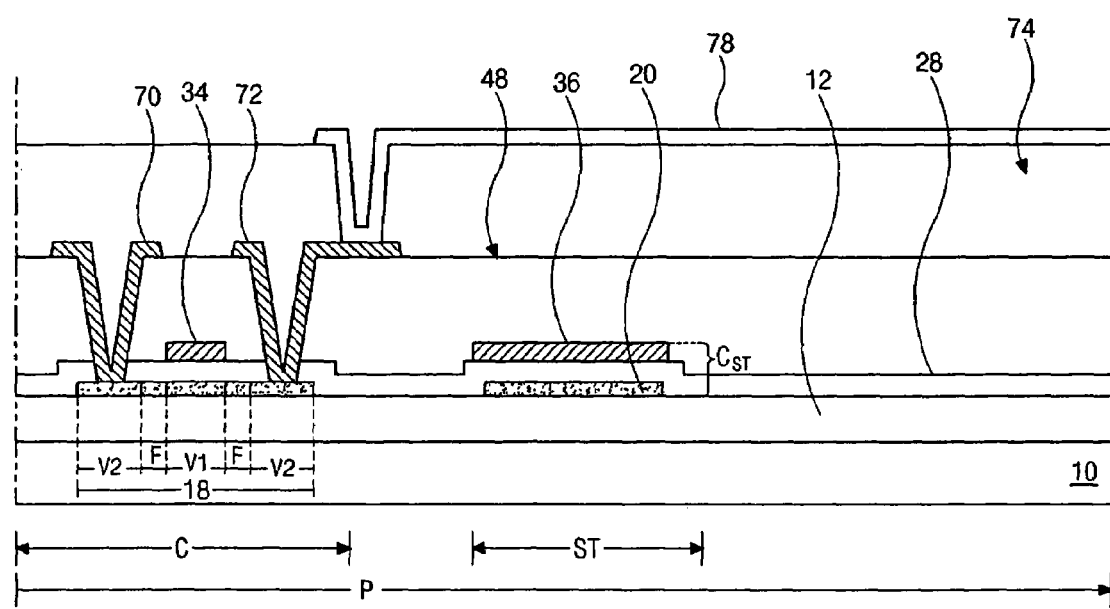
Figure 4A:
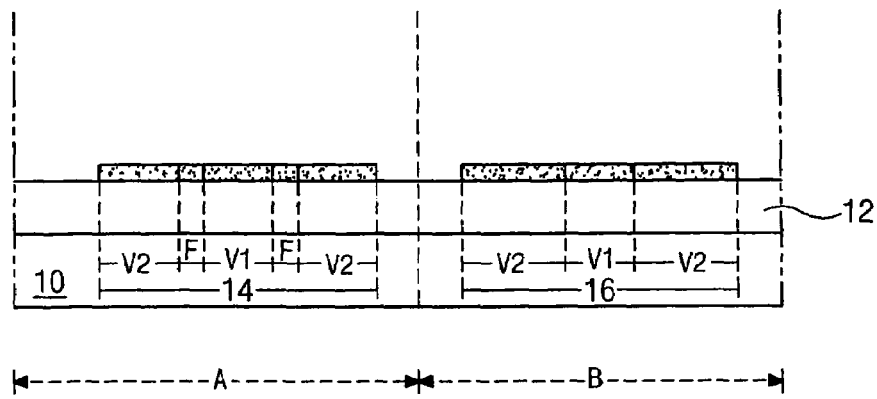
Figure 4B:
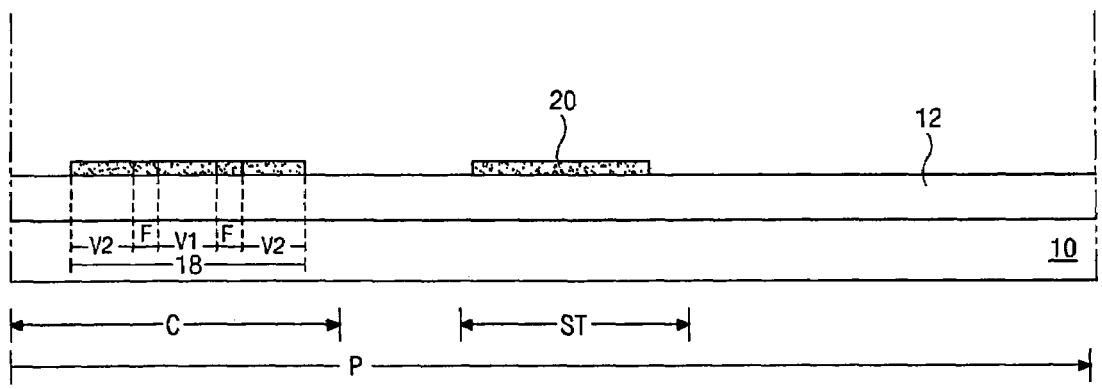
Figure 5A:
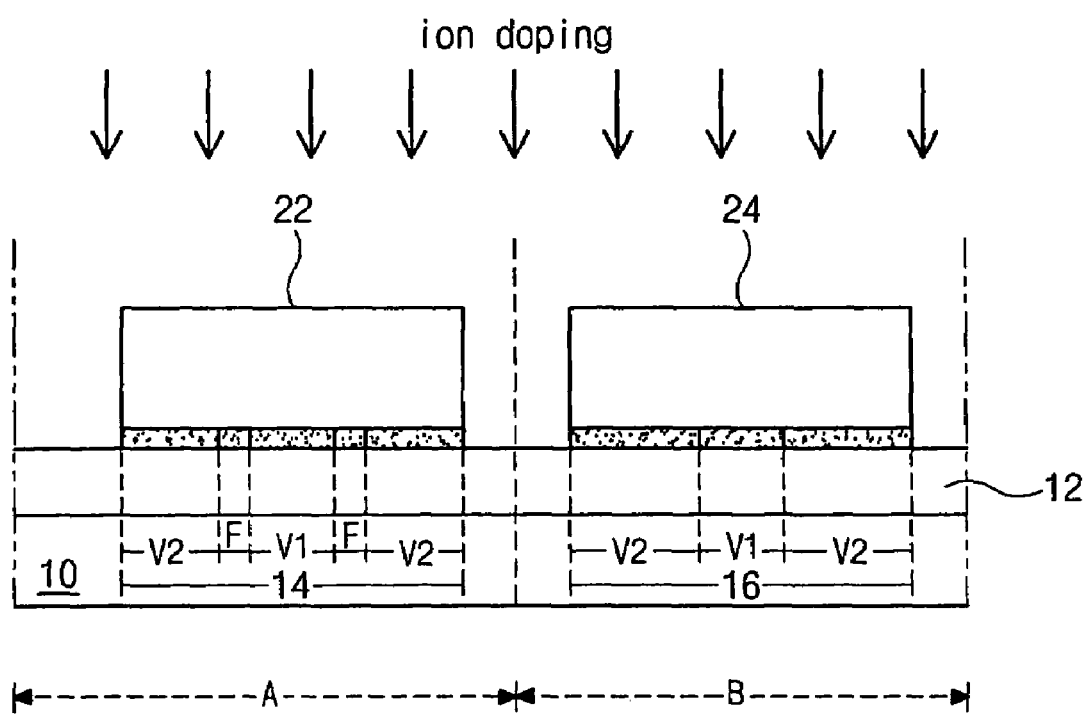
Figure 5B:
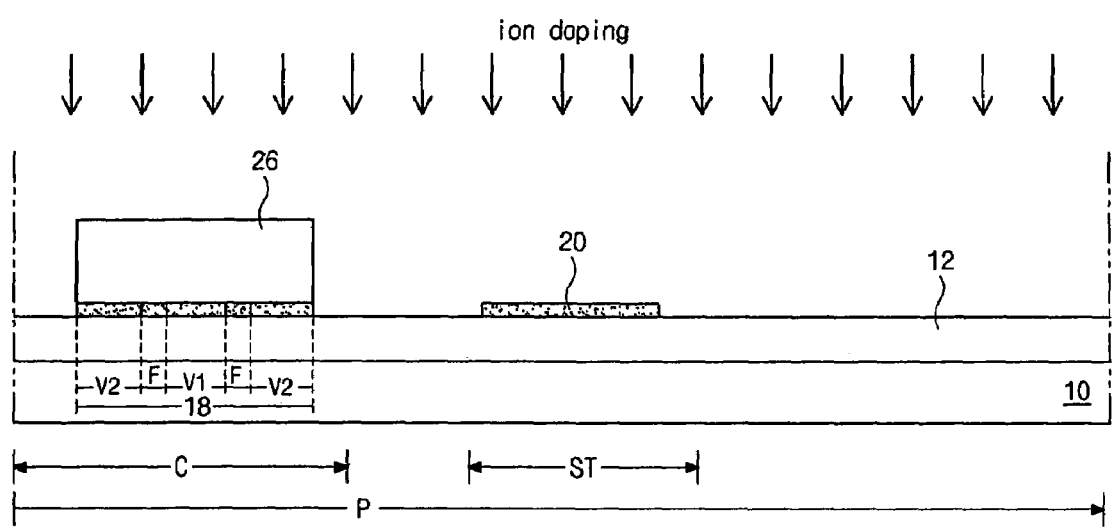
Figure 6A:
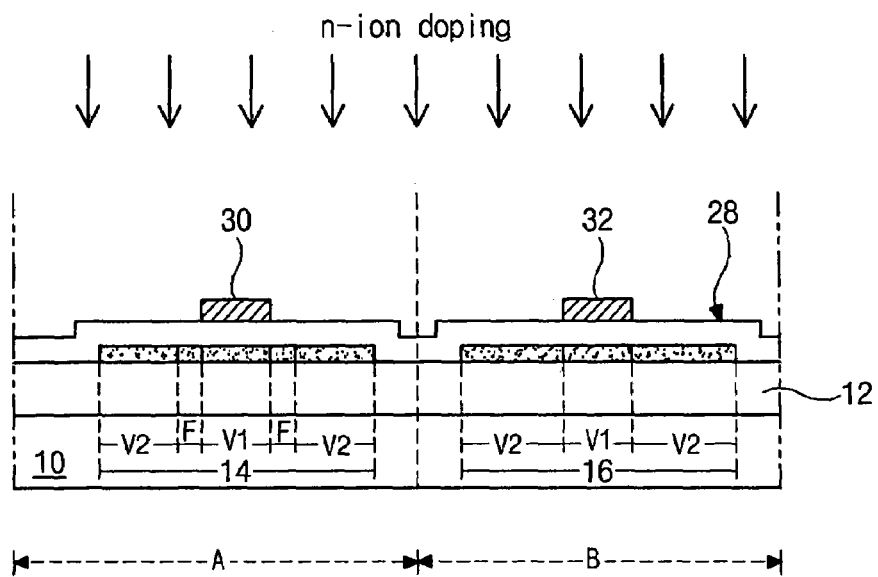
Figure 6B:
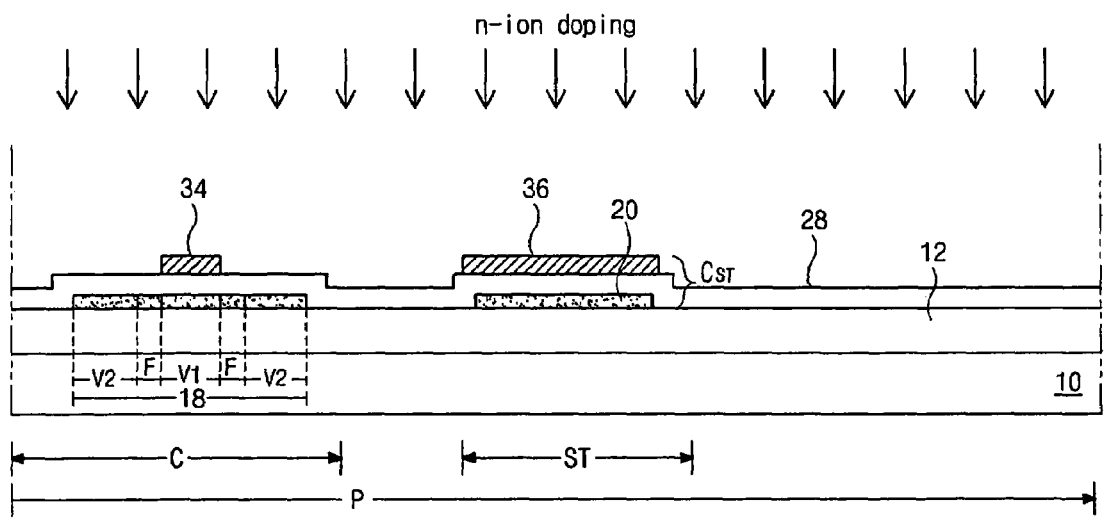
Figure 7A:
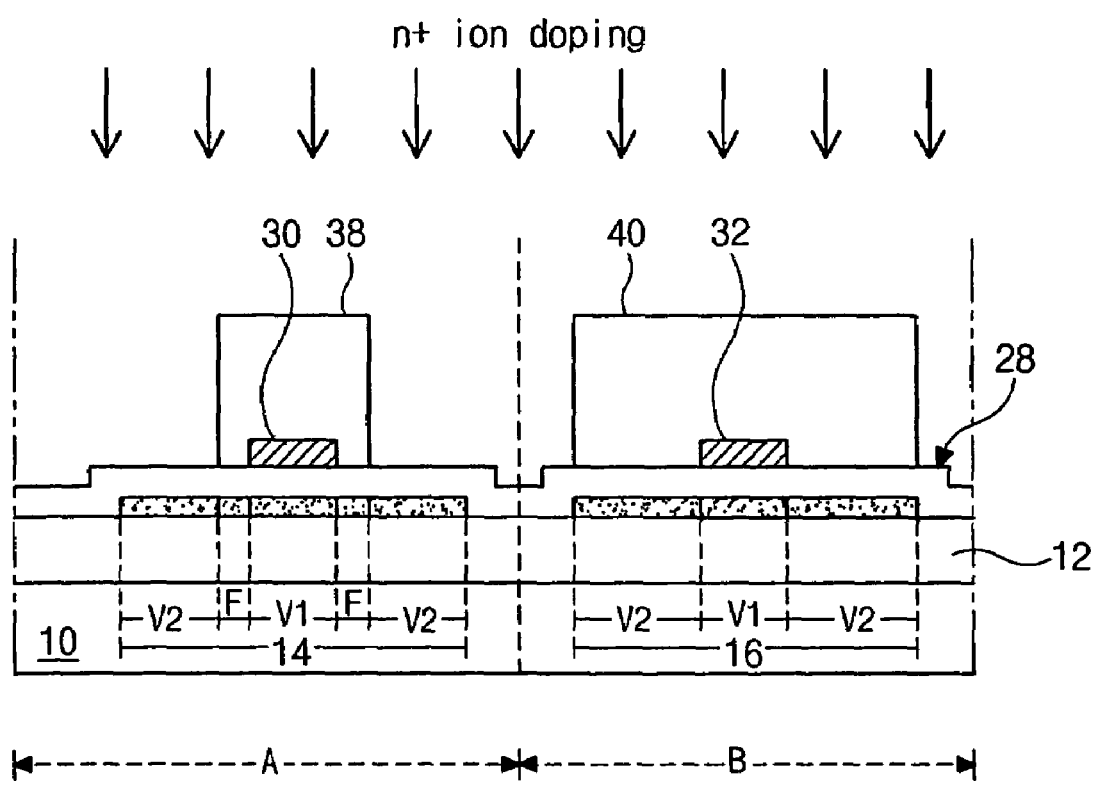
Figure 7B:
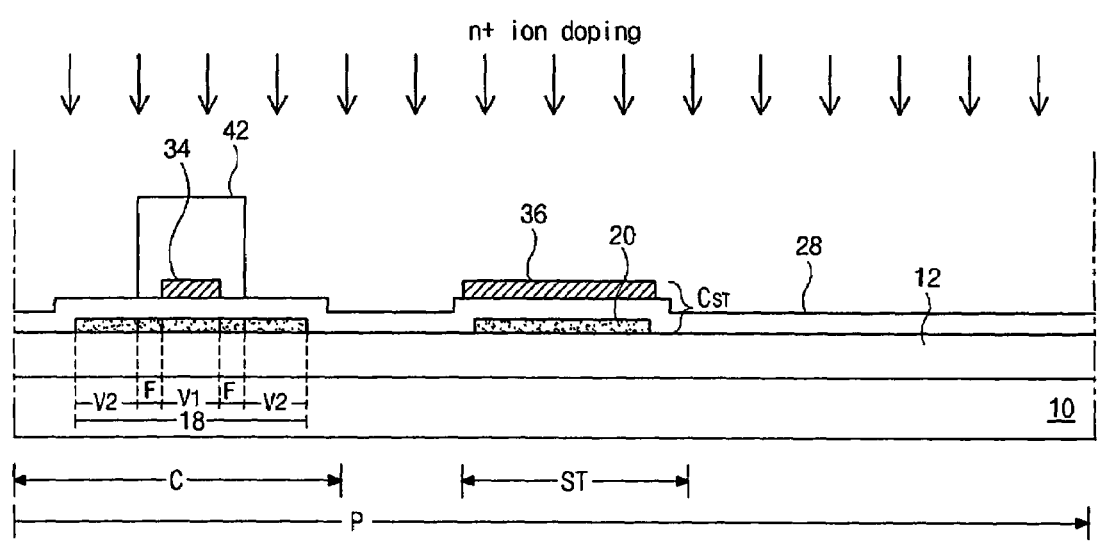
Figure 8A:
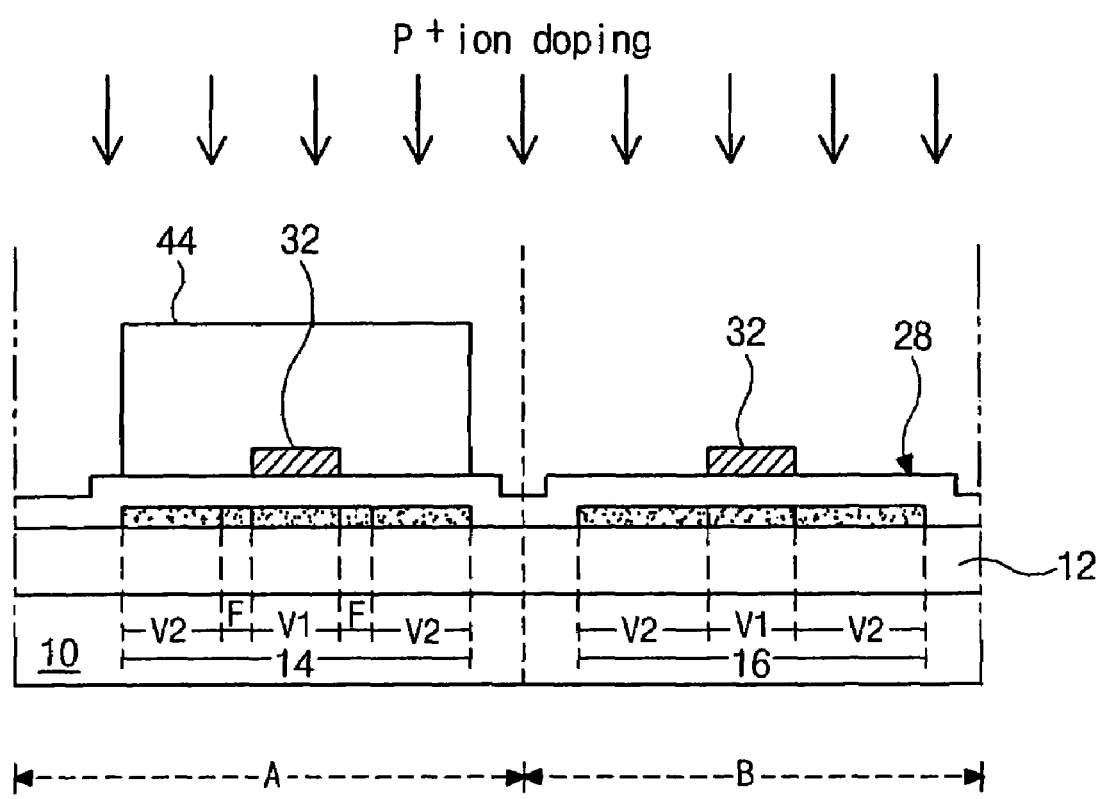
Figure 8B:
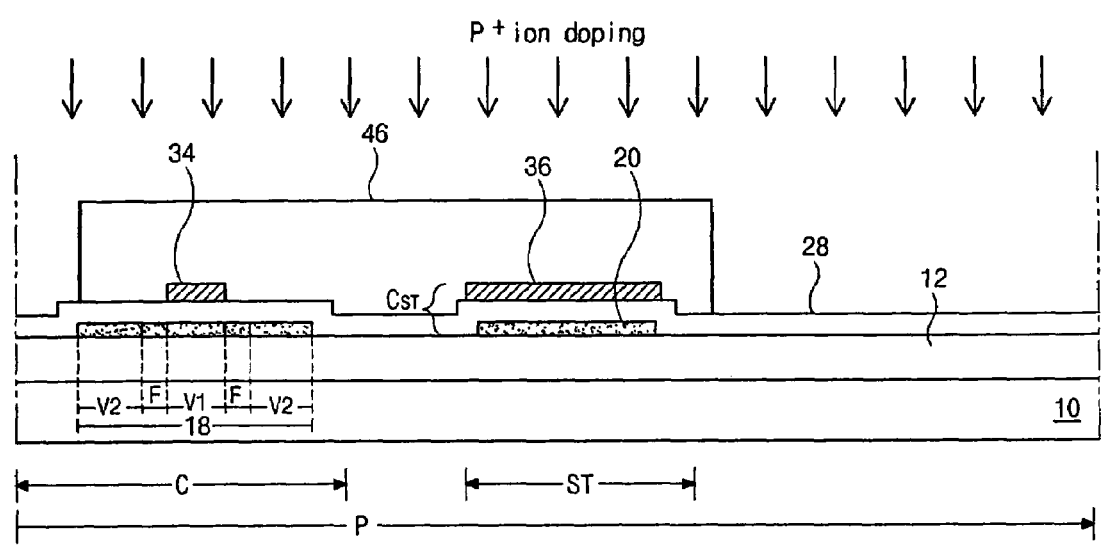
Figure 9A:
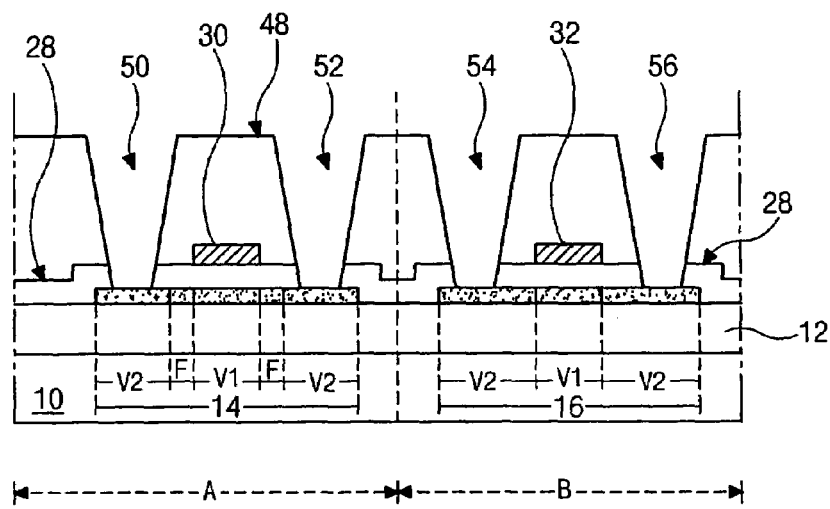
Figure 9B:
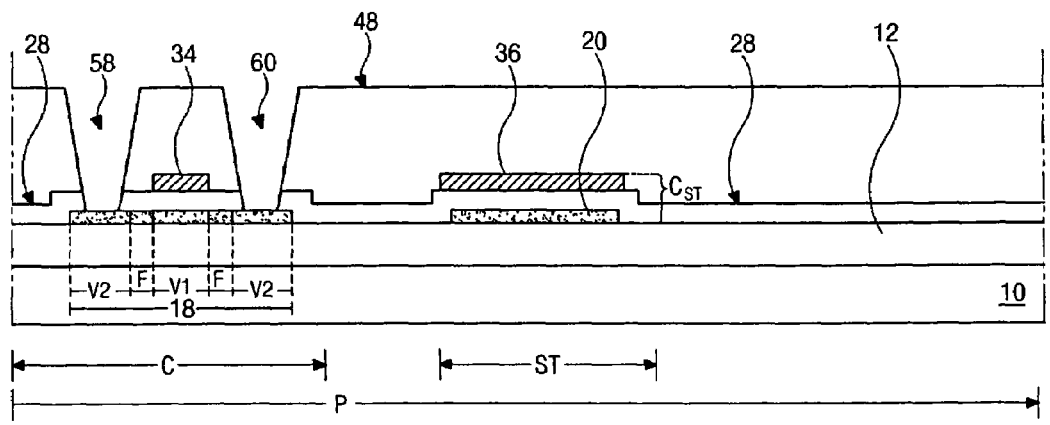
Figure 10A:
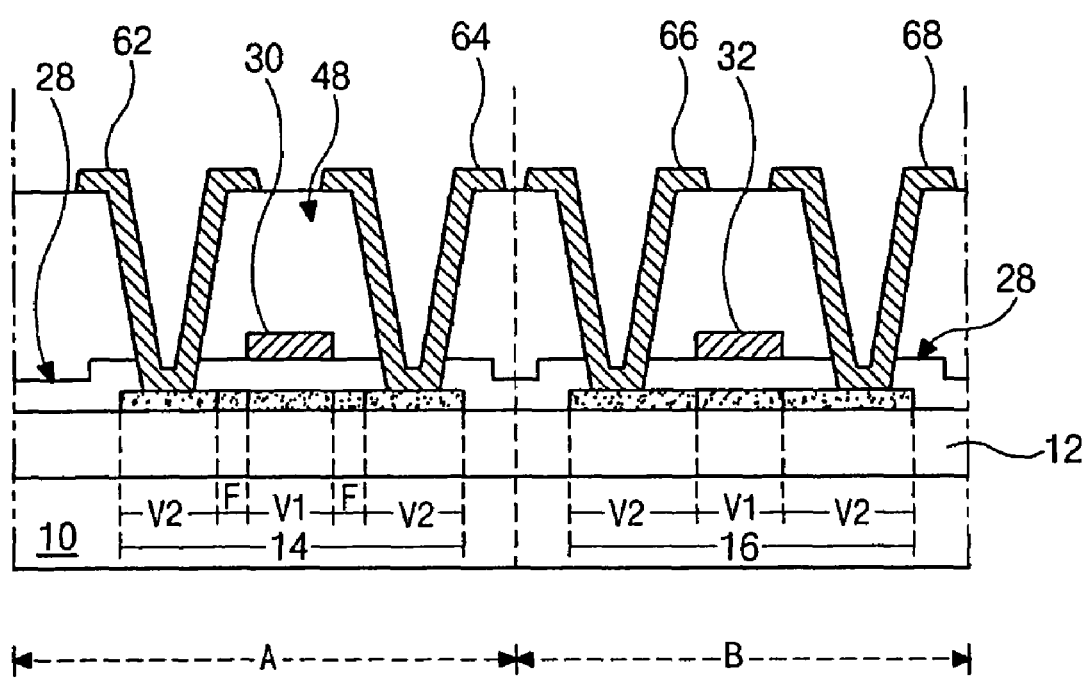
Figure 10B:
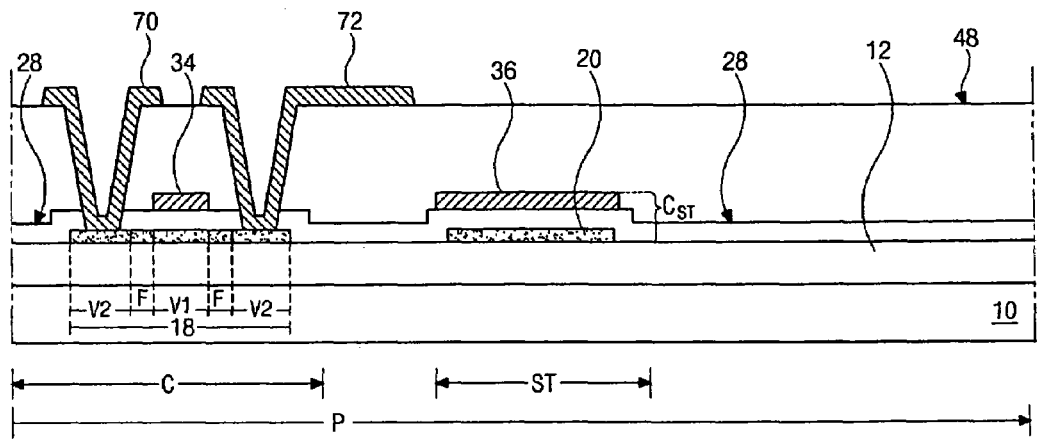
Figure 11A:
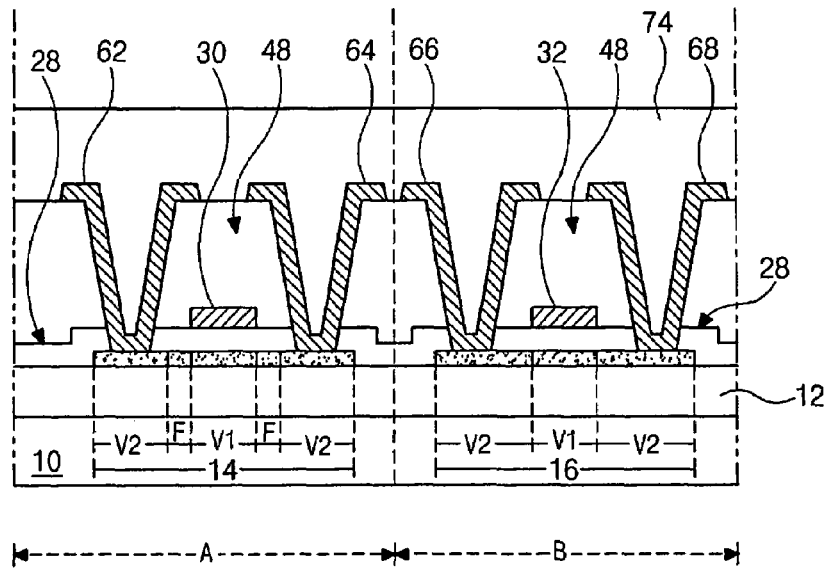
Figure 11B:
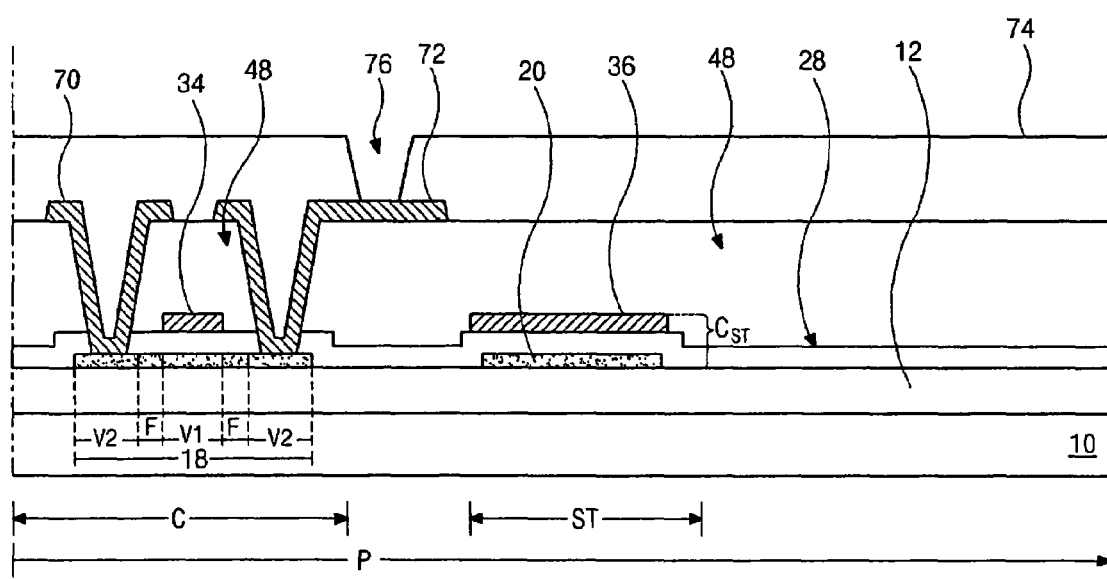
Figure 12A:
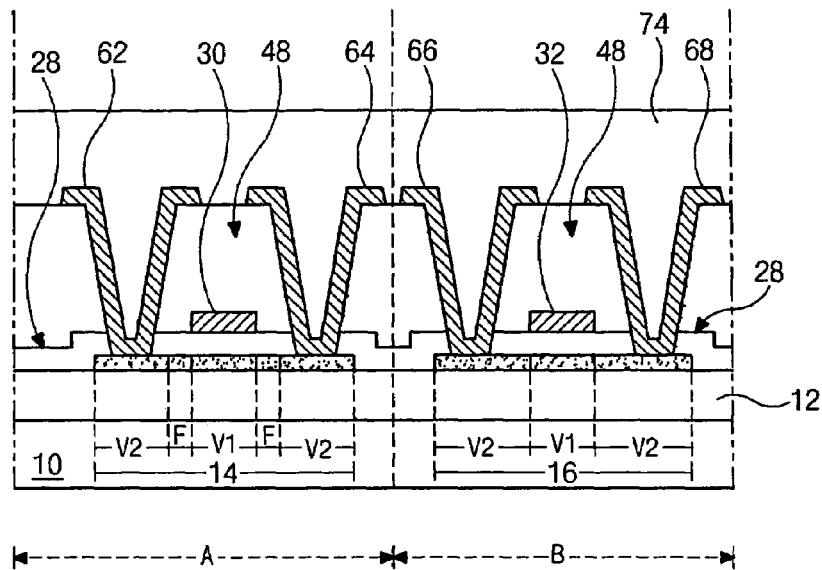
Figure 12B:
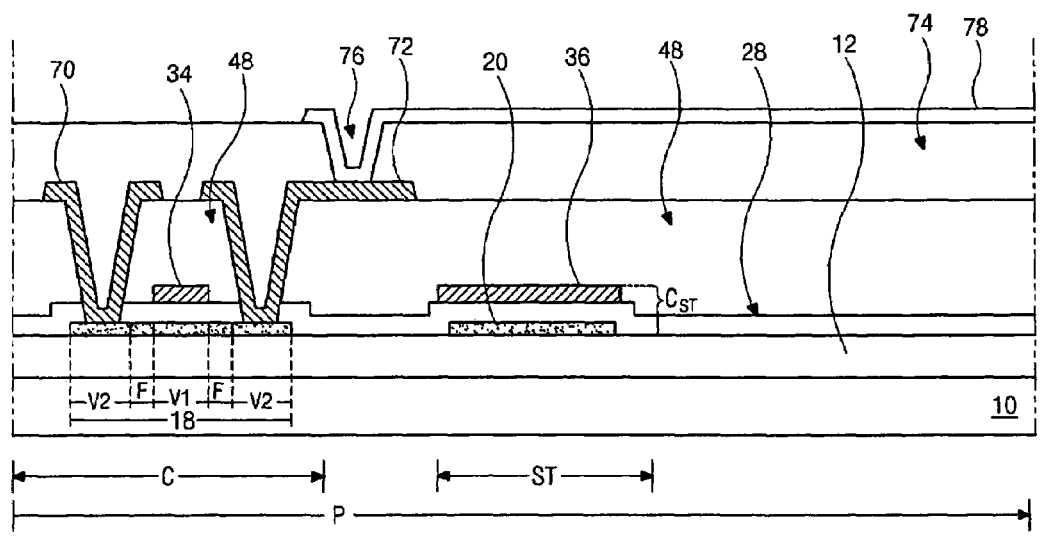
Figure 13:
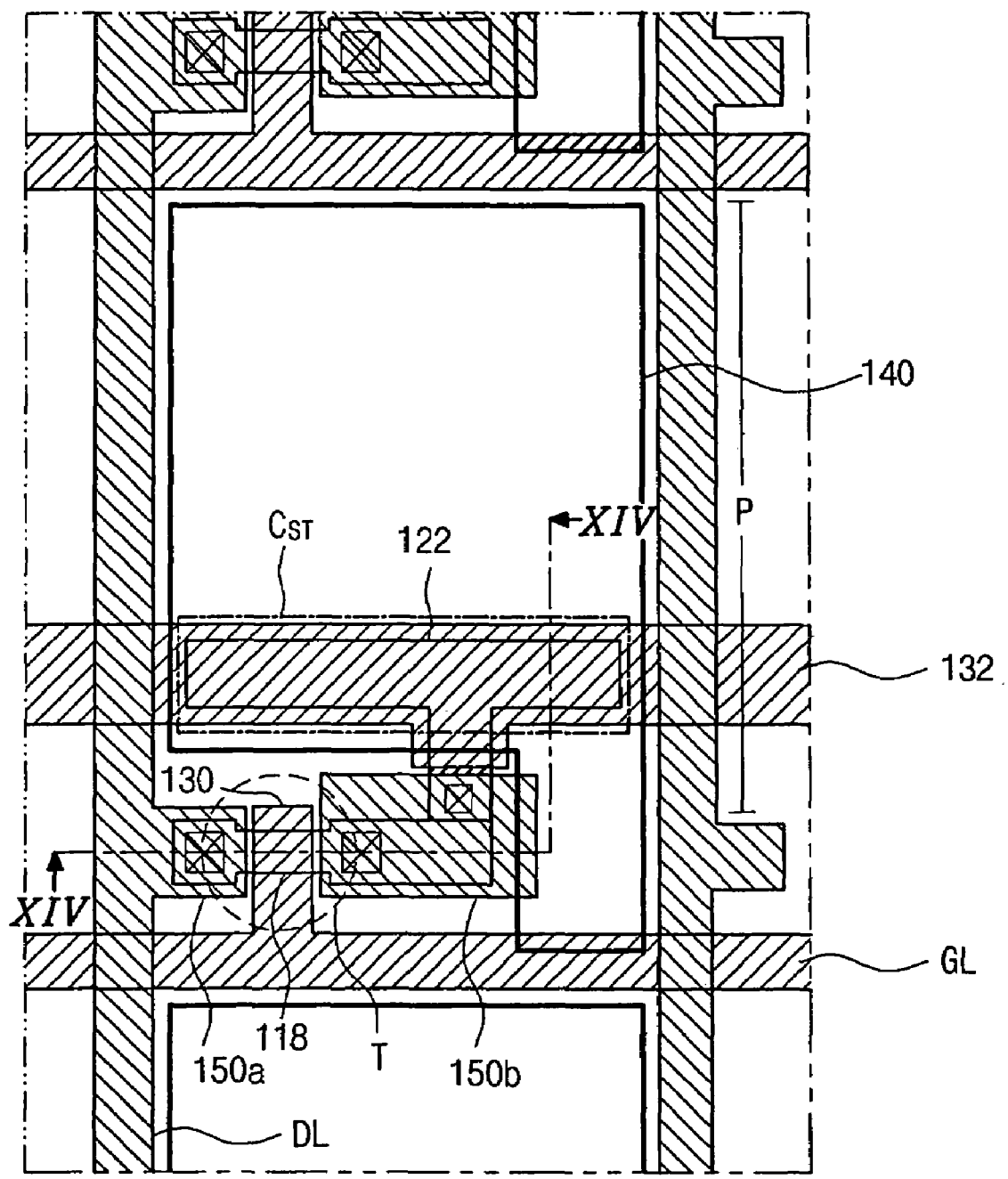
FIG. 13 is a plan view of an exemplary pixel region of an array substrate including a polycrystalline silicon thin film transistor according to an embodiment of the present invention.

FIG. 13 is a plan view of an exemplary pixel region of an array substrate including a polycrystalline silicon thin film transistor according to an embodiment of the present invention. Referring to FIG. 13, one or more gate line GL is formed along a first direction on a substrate. One or more data line DL is formed on the substrate along a second direction perpendicular to the first direction. The one or more gate line GL and the one or more data line DL cross each other to define a pixel region P.

A thin film transistor T is formed at the crossing portion of the gate and data lines GL and DL. The thin film transistor T includes an active layer 118 of polycrystalline silicon, a gate electrode 130 over the active layer 118, and source and drain electrodes 150a and 150b contacting the active layer 118. A pixel electrode 140 is formed in the pixel region P and is connected to the drain electrode 150b.

A storage capacitor $C^{ST}$ is also formed in the pixel region P. The storage capacitor $C^{ST}$ includes two parallel capacitors. The first of the two parallel capacitors is formed by a metal pattern 122 and a storage line 132. The second of the two parallel capacitors is formed by the storage line 132 and the pixel electrode 140. The metal pattern 122 is disposed on an extension portion (not shown) extending from the active layer 118 and is electrically connected to the drain electrode 150b. The storage line 132 overlaps the metal pattern 122. The pixel electrode 140 overlaps the storage line 132 and is connected the drain electrode 150b. Hereinafter, a method of manufacturing an array substrate including driver integrated circuits (ICs) according to an embodiment of the present invention will be explained with reference to attached drawings.

Figure 14A:
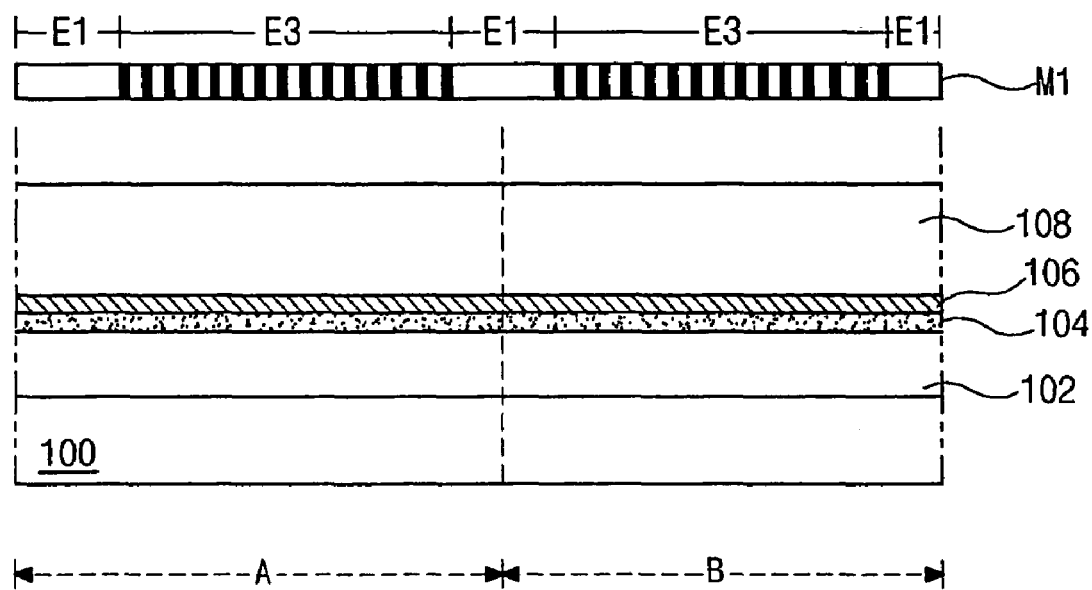
FIG. 14A is a cross-sectional view illustrating the formation of a metal layer in a driving region of the array substrate of FIG. 13 using a first mask process in accordance with an embodiment of the present invention.
Figure 14B:
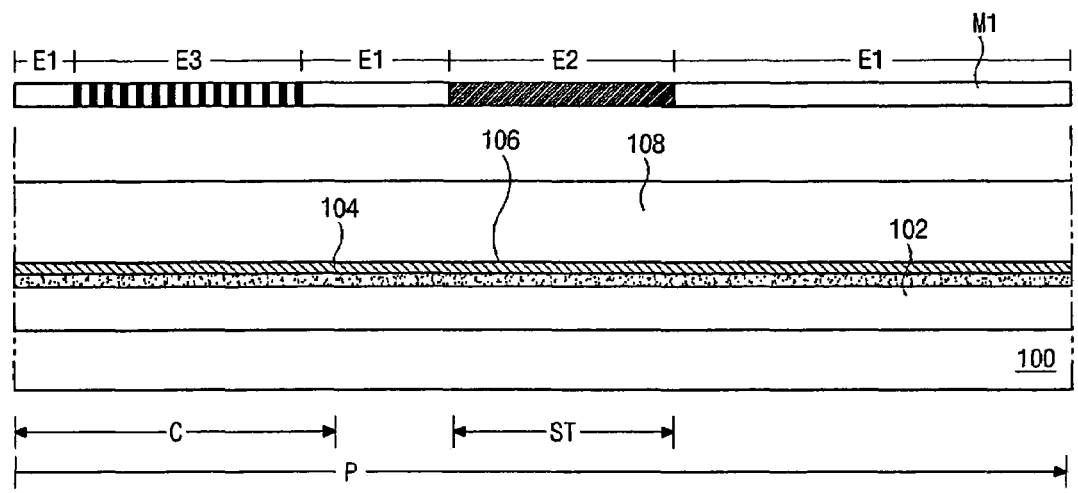
FIG. 14B is a cross-sectional view along line XIV-XIV of FIG. 13 illustrating the formation of a metal layer in a pixel region of the array substrate of FIG. 13 during the first mask process.

FIG. 14A is a cross-sectional view illustrating the formation of a metal layer in a driving region of the array substrate of FIG. 13 using a first mask process in accordance with an embodiment of the present invention. FIG. 14B is a cross-sectional view along line XIV-XIV of FIG. 13 illustrating the formation of a metal layer in a pixel region of the array substrate of FIG. 13 during the first mask process. Referring to FIG. 14A, a first driving region A and a second driving region B are defined on a substrate 100. Referring to FIG. 14B, a pixel region P, which includes a switching region C and a storage region ST, is defined on the substrate 100. A buffer layer 102 is formed on the substrate 100, including the first and second driving regions A and B, and the pixel region P, by depositing, for example, silicon nitride ($SiN_x$) or silicon oxide ($SiO_2$). A polycrystalline silicon layer 104 and a metal layer 106 are formed on the buffer-layer 102. The polycrystalline silicon layer 104 may be formed by sequentially depositing, dehydrogenating, and crystallizing amorphous silicon (a-Si:H).

Next, a photoresist layer 108 is formed on the metal layer 106 by coating a photoresist material. A mask M1 is disposed over the photoresist layer 108. The mask M1 includes a transmitting portion E1, a blocking portion E2 and a half transmitting portion E3. The half transmitting portion E3 may include a semitransparent film or slits. The half transmitting portion E3 corresponds to the first driving region A, the second driving region B and the switching region C. The blocking portion E2 corresponds to the storage region ST, and the transmitting portion E1 corresponds to the other regions. The photoresist layer 108 is exposed to light through the mask M1. Then, the photoresist layer 108 is developed.

Figure 15A:
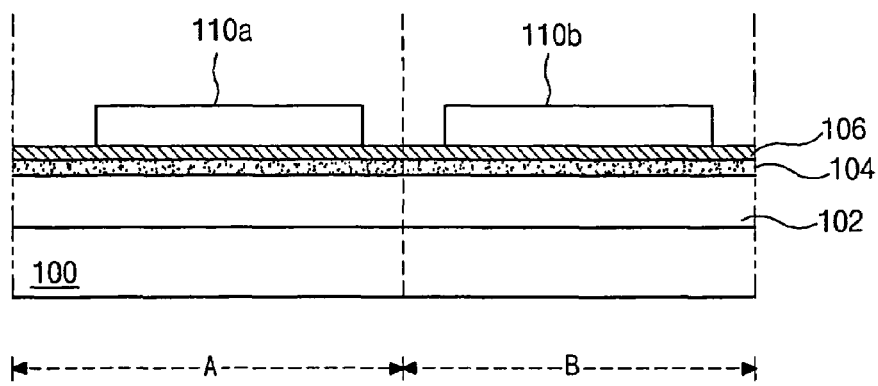
FIG. 15A is a cross-sectional view of the formation of a photoresist pattern in a driving region of the array substrate of FIG. 13 during the first mask process.
Figure 15B:
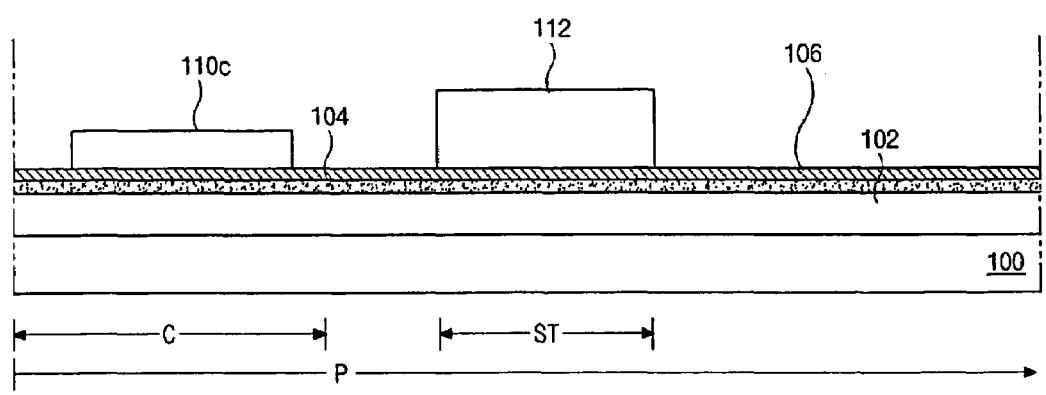
FIG. 15B is a cross-sectional view along line XIV-XIV of FIG. 13 illustrating the formation of a photoresist pattern in a pixel region of the array substrate of FIG. 13 during the first mask process.

FIG. 15A is a cross-sectional view of the formation of a photoresist pattern in a driving region of the array substrate of FIG. 13 during the first mask process. FIG. 15B is a cross-sectional view along line XIV-XIV of FIG. 13 illustrating the formation of a photoresist pattern in a pixel region of the array substrate of FIG. 13 during the first mask process. Referring to FIGS. 15A and 15B, first, second, third and fourth photoresist patterns 110a, 110b, 110c and 112 are formed. The first, second, and third photoresist patterns 110a, 110b and 110c are formed in the first driving region A, the second driving region B and the switching region C, respectively. The first, second, and third photoresist patterns 110a, 110b and 110c have a first thickness. The fourth photoresist pattern 112 is formed in the storage region ST and is thicker than the first to third photoresist patterns 110a, 110b and 110c. The first to fourth photoresist patterns 110a; 110b, 110c, and 112 expose portions of the metal layer 106 in the pixel region P and the first and second driving regions A and B.

Figure 16A:
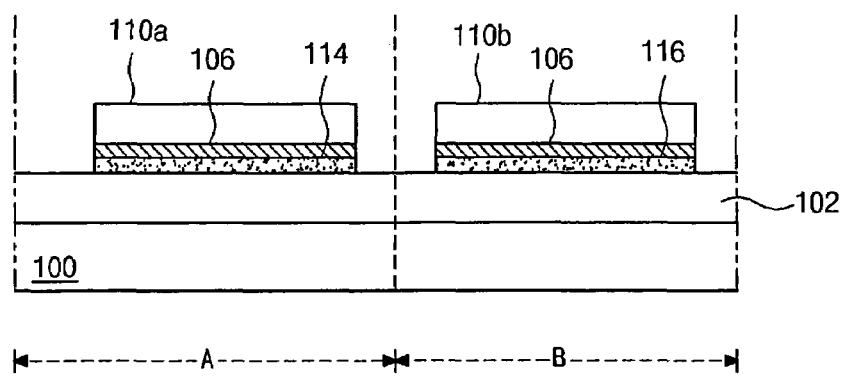
FIG. 16A is a cross-sectional view of the formation of a metal pattern in a driving region of the array substrate of FIG. 13 during the first mask process.
Figure 16B:
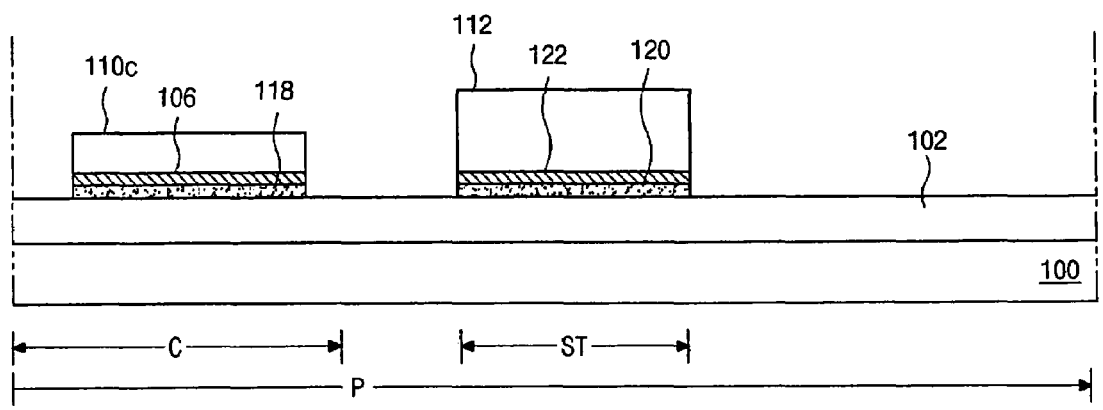
FIG. 16B is a cross-sectional view along line XIV-XIV of FIG. 13 illustrating the formation of a metal pattern in a pixel region of the array substrate of FIG. 13 during the first mask process.

FIG. 16A is a cross-sectional view of the formation of a metal pattern in a driving region of the array substrate of FIG. 13 during the first mask process. FIG. 16B is a cross-sectional view along line XIV-XIV of FIG. 13 illustrating the formation of a metal pattern in a pixel region of the array substrate of FIG. 13 during the first mask process. Referring to FIGS. 16A and 16B, the exposed portions of the metal layer 106 and the polycrystalline silicon layer 104 thereunder are removed. The metal layer 106 may be removed by a wet etch method. The polycrystalline silicon layer 104 may be removed by a dry etch method. The remaining pattern on the buffer layer 102 in the first driving region A includes a polycrystalline silicon patterned layer 114, the metal patterned layer 106, and the photoresist pattern 110a in stacking order. The remaining pattern on the buffer layer 102 in the second driving region B includes a polycrystalline silicon patterned layer 116, a metal patterned layer 106, and the photoresist pattern 110b in stacking order. The remaining pattern on the buffer layer 102 in the switching region C of the pixel region P includes a polycrystalline silicon patterned layer 118, the metal patterned layer 106, and the photoresist pattern 110c in stacking order. The remaining pattern on the buffer layer 102 in the storage region ST of the pixel region P includes a polycrystalline silicon patterned layer 120, the metal patterned layer 122, and the photoresist pattern 112 in stacking order.

Figure 17A:
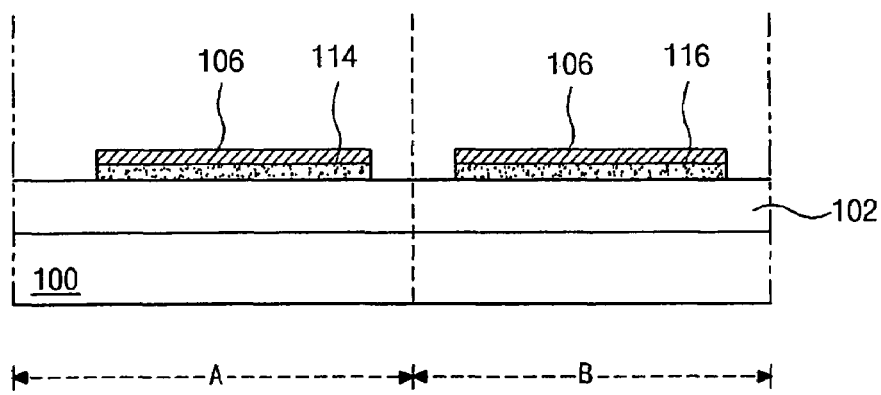
FIG. 17A is a cross-sectional view of an ashing of a photoresist pattern in a driving region of the array substrate of FIG. 13 during the first mask process.
Figure 17B:
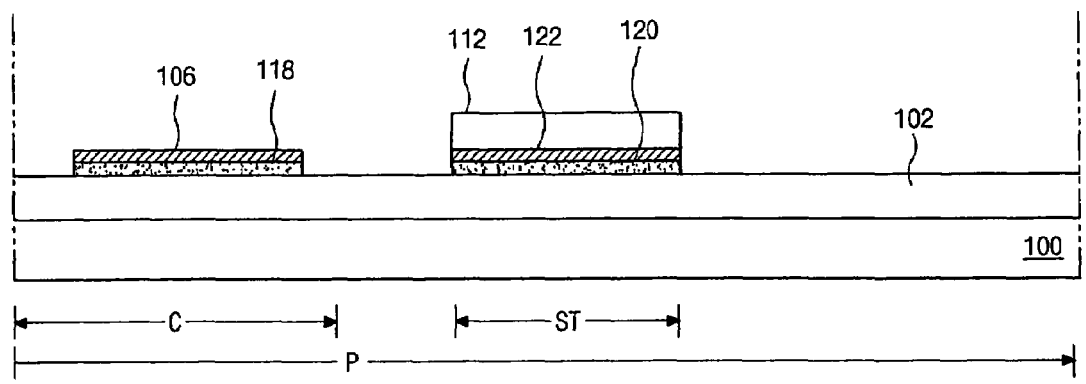
FIG. 17B is a cross-sectional view along line XIV-XIV of FIG. 13 illustrating an ashing of a photoresist pattern in a pixel region of the array substrate of FIG. 13 during the first mask process.

FIG. 17A is a cross-sectional view of an ashing process of a photoresist pattern in a driving region of the array substrate of FIG. 13 during the first mask process. FIG. 17B is a cross-sectional view along line XIV-XIV of FIG. 13 illustrating an ashing of a photoresist pattern in a pixel region of the array substrate of FIG. 13 during the first mask process. Referring to FIGS. 17A and 17B, an ashing process is performed. The first, second and third photoresist patterns 110a, 110b and 110c shown in FIGS. 16A and 16B are removed by the ashing process, thereby exposing the metal layer 106 in the first driving region A, the second driving region B and the switching region C. The thickness of the fourth photoresist pattern 112 is also reduced by the ashing process.

Figure 18A:
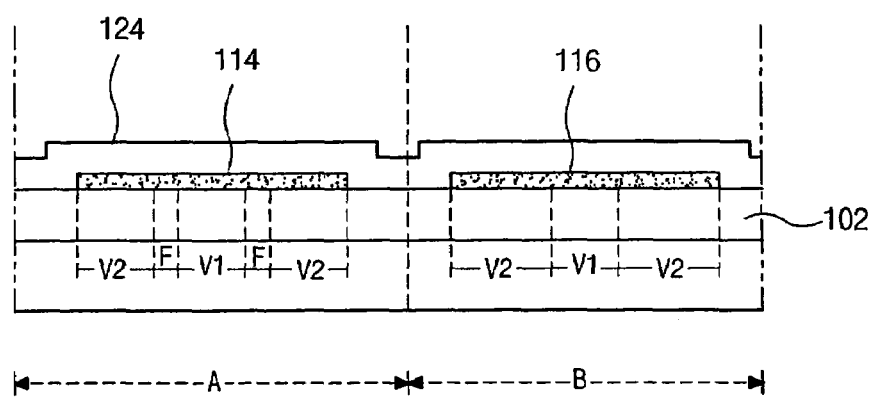
FIG. 18A is a cross-sectional view of the formation of a gate insulating layer in a driving region of the array substrate of FIG. 13 following the first mask process.
Figure 18B:
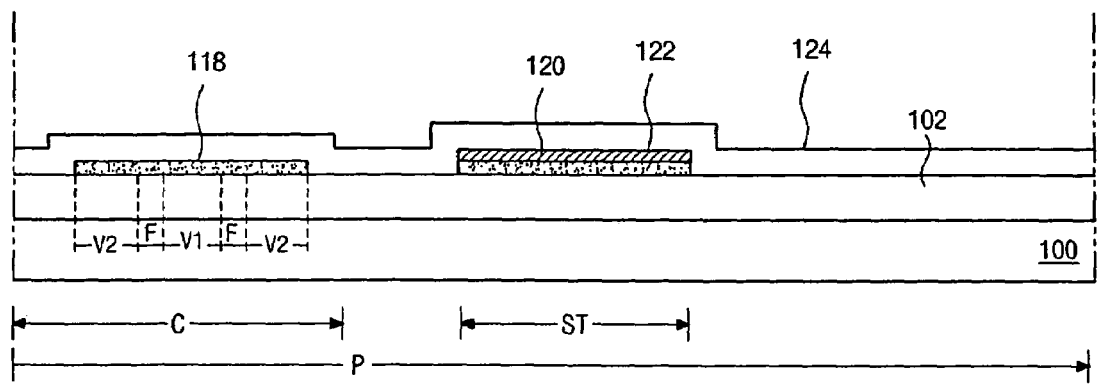
FIG. 18B is a cross-sectional view along line XIV-XIV of FIG. 13 illustrating the formation of a gate insulating layer in a pixel region of the array substrate of FIG. 13 following the first mask process.

FIG. 18A is a cross-sectional view of the formation of a gate insulating layer in a driving region of the array substrate of FIG. 13 following the first mask process. FIG. 18B is a cross-sectional view along line XIV-XIV of FIG. 13 illustrating the formation of a gate insulating layer in a pixel region of the array substrate of FIG. 13 following the first mask process. Referring to FIGS. 18A and 18B, the exposed metal layer 106 is removed from the first and second driving regions A and B and the switching region C, and the fourth photoresist pattern 112 is removed from the storage region ST. First, second, and third active patterns 114, 116, and 118 are formed on the buffer layer 102 in the first driving region A, the second driving region B, and the switching region C, respectively. An extension portion 120 and a metal pattern 122 are formed on the buffer layer 102 in the storage region ST. The extension portion 120 extends from the third active pattern 118, and the metal pattern 122 is disposed on the extension portion 120. Each of the first, second and third active patterns 114, 116 and 118 includes an intrinsic portion V1 and doped portions V2 at both sides of the intrinsic portion V1. The first and third active patterns 114 and 118 further include a lightly doped drain (LDD) portion F between the intrinsic portion V1 and each doped portion V2. Then, a gate insulating layer 124 is formed on the entire surface of the substrate 100 covering the first, second and third active patterns 114, 116 and 118, the extension portion 120 and the metal pattern 122 thereon. The gate insulating layer 124 may be formed of an inorganic insulating material such as silicon nitride ($SiN_x$) or silicon oxide ($SiO_2$).

Figure 19A:
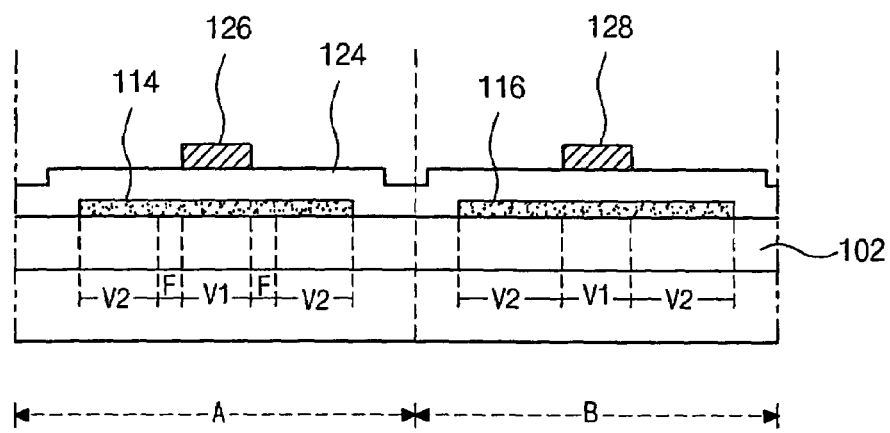
FIG. 19A is a cross-sectional view of the formation of a plurality of electrodes in a driving region of the array substrate of FIG. 13 during a second mask process.
Figure 19B:
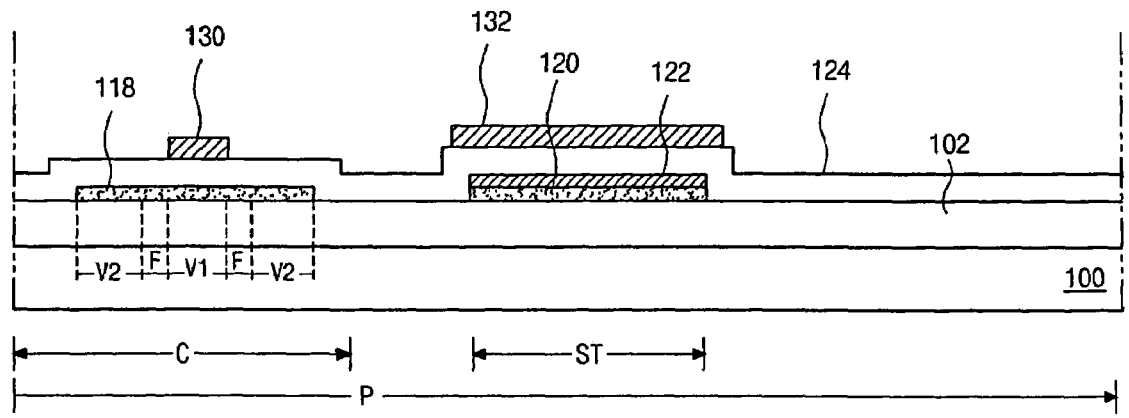
FIG. 19B is a cross-sectional view along line XIV-XIV of FIG. 13 illustrating the formation of an electrode and a storage line in a pixel region of the array substrate of FIG. 13 during the second mask process.

FIG. 19A is a cross-sectional view of the formation of a plurality of electrodes in a driving region of the array substrate of FIG. 13 during a second mask process. FIG. 19B is a cross-sectional view along line XIV-XIV of FIG. 13 illustrating the formation of an electrode and a storage line in a pixel region of the array substrate of FIG. 13 during the second mask process. Referring to FIGS. 19A and 19B, first, second and third gate electrodes 126, 128 and 130 and a storage line 132 are formed on the gate insulating layer 124 by sequentially depositing and patterning a metallic material through a second mask process. The metallic material may include aluminum (Al), an aluminum alloy (AlNd), copper (Cu), molybdenum (Mo), tungsten (W) or chromium (Cr). The first, second and third gate electrodes 126, 128 and 130 correspond to the intrinsic portions V1 of the first, second and third active patterns 114, 116 and 118, respectively. The storage line 132 is disposed over the metal pattern 122 in the storage region ST. As shown in FIG. 13, the storage line 132 crosses the pixel region P. Concurrently, a gate line GL (shown in FIG. 13) is formed and is connected to the third gate electrode 130 in the switching region C.

Figure 20A:
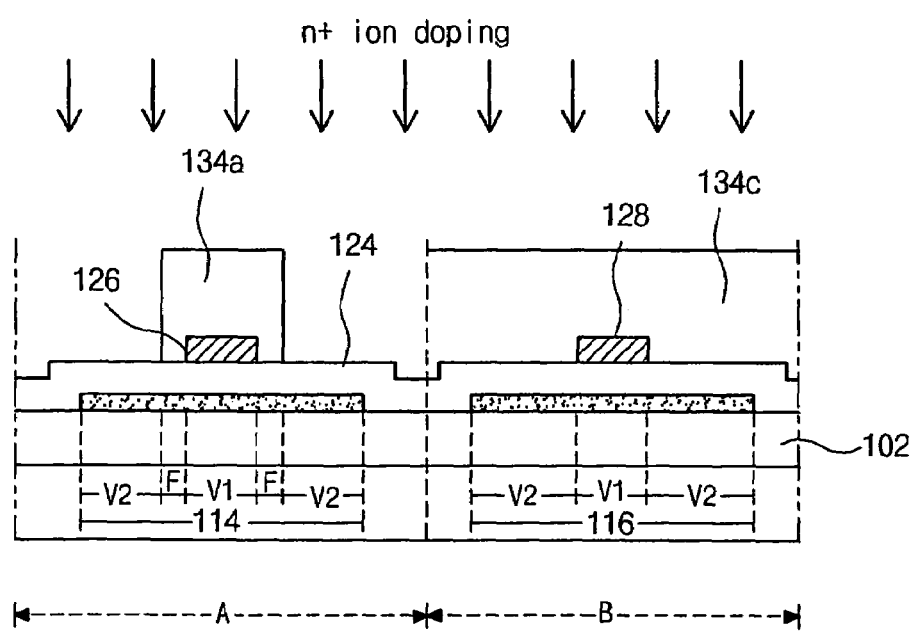
FIG. 20A is a cross-sectional view of the formation of a photoresist pattern in a driving region of the array substrate of FIG. 13 during a third mask process.
Figure 20B:
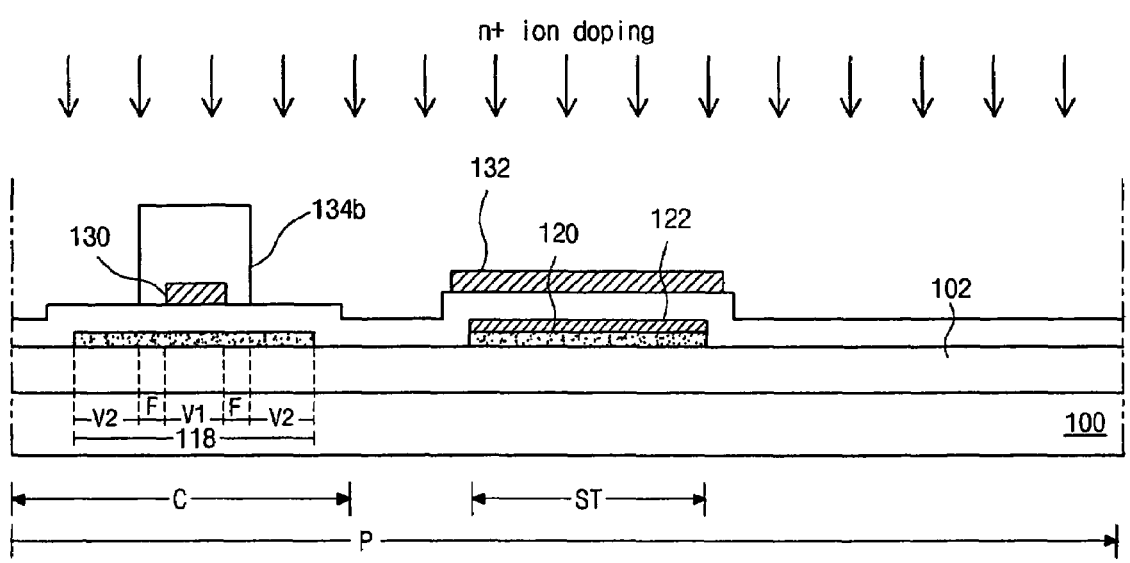
FIG. 20B is a cross-sectional view along line XIV-XIV of FIG. 13 illustrating the formation of a photoresist pattern in a pixel region of the array substrate of FIG. 13 during the third mask process.

FIG. 20A is a cross-sectional view of the formation of a photoresist pattern in a driving region of the array substrate of FIG. 13 during a third mask process. FIG. 20B is a cross-sectional view along line XIV-XIV of FIG. 13 illustrating the formation of a photoresist pattern in a pixel region of the array substrate of FIG. 13 during the third mask process. Referring to FIGS. 20A and 20B, a photoresist material is coated on the entire surface of the substrate 100 to cover the first, second and third gate electrodes 126, 128 and 130 and the storage line 132. Then, the photoresist material is patterned through a third mask process to form fifth, sixth and seventh photoresist patterns 134a, 134b and 134c. The fifth photoresist pattern 134a covers the first gate electrode 126 and the LDD portions F of the first active pattern 114. The sixth photoresist pattern 134b covers the third gate electrode 130 and the LDD portions F of the third active pattern 118. The seventh photoresist pattern 134c covers the second gate electrode 128 and the second active pattern 116. Here, the doped portions V2 of the first and third active patterns 114 and 118 are exposed. In this embodiment of the present invention, no resist pattern is formed in the pixel region P excluding the switching region C. In another embodiment of the present invention, another photoresist pattern may be formed in the pixel region P excluding the switching region C. Next, $n^+$ ion doping is performed on the entire surface of the substrate 100, including the fifth, sixth and seventh photoresist patterns 134a, 134b and 134c. Therefore, n-type ions are heavily doped in the doped portions V2 of the first and third active patterns 114 and 118.

Figure 21A:
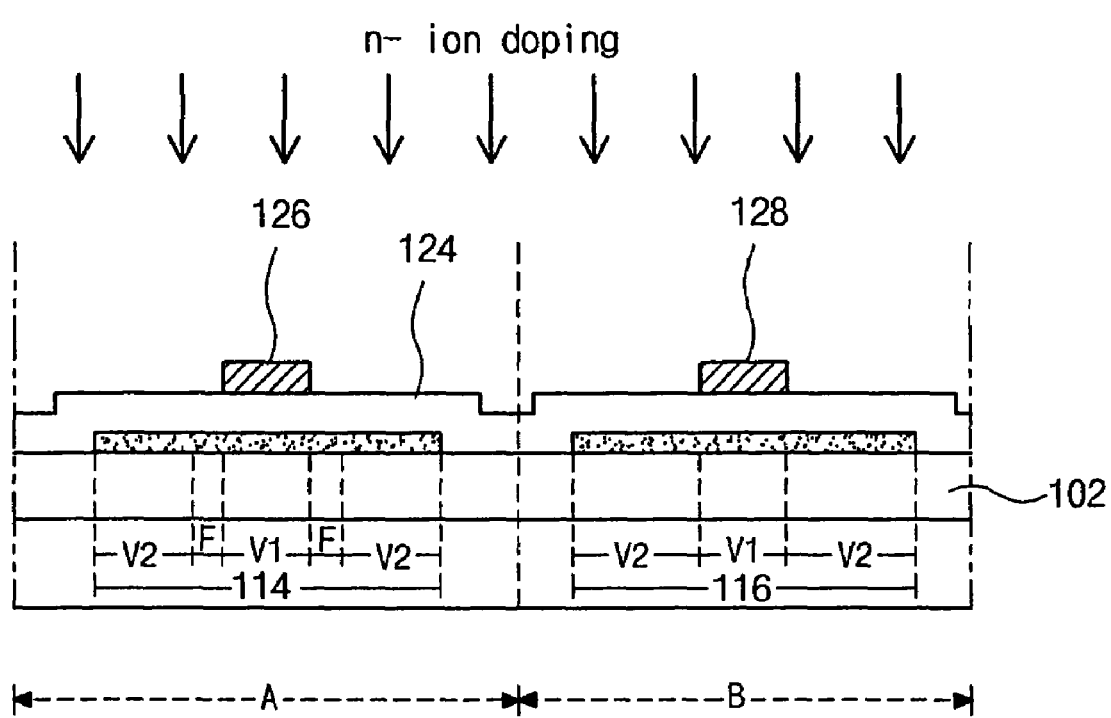
FIG. 21A is a cross-sectional view showing an ion doping of a driving region of the array substrate of FIG. 13 during a third mask process.
Figure 21B:
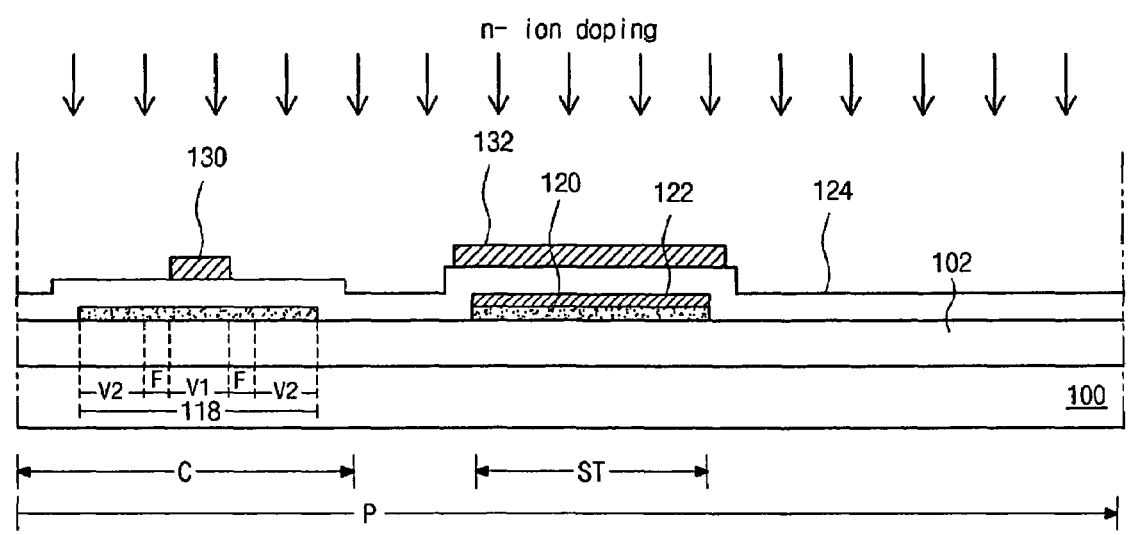
FIG. 21B is a cross-sectional view along line XIV-XIV of FIG. 13 showing an ion doping of a pixel region of the array substrate of FIG. 13 during the third mask process.

FIG. 21A is a cross-sectional view showing an ion doping of a driving region of the array substrate of FIG. 13 during a third mask process. FIG. 21B is a cross-sectional view along line XIV-XIV of FIG. 13 showing an ion doping of a pixel region of the array substrate of FIG. 13 during the third mask process. Referring to FIGS. 21A and 21B, the fifth, sixth and seventh photoresist patterns 134a, 134b and 134c are removed, and the first, second and third gate electrodes 126, 128 and 130 are exposed. $N^-$ ion doping is carried out on the entire surface of the substrate 100 where $n^+$ doping was performed. Here, the first, second and third gate electrodes 126, 128 and 130 are used as a doping mask. Thus, the LDD portions F of the first and third active patterns 114 and 118 and the doped portions V2 of the first, second and third active patterns 114, 116 and 118 are lightly doped with n-type ions. The doped portions V2 of the first and third active patterns 114 and 118 are heavily doped with n-type ions, because the $n^-$ ion doping process doped more n-type ions in the doped portions V2 of the first and third active patterns 114 and 118.

Figure 22A:
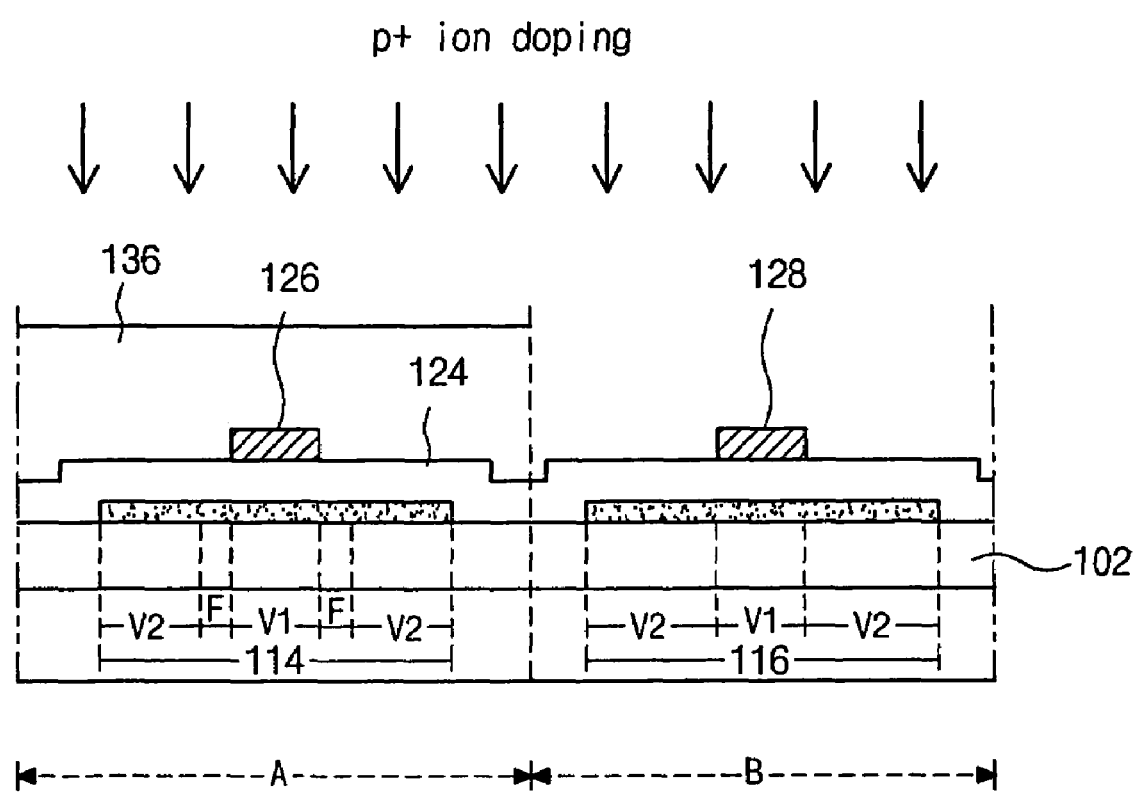
FIG. 22A is a cross-sectional view of the formation of a photoresist pattern in a driving region of the array substrate of FIG. 13 during a fourth mask process.
Figure 22B:
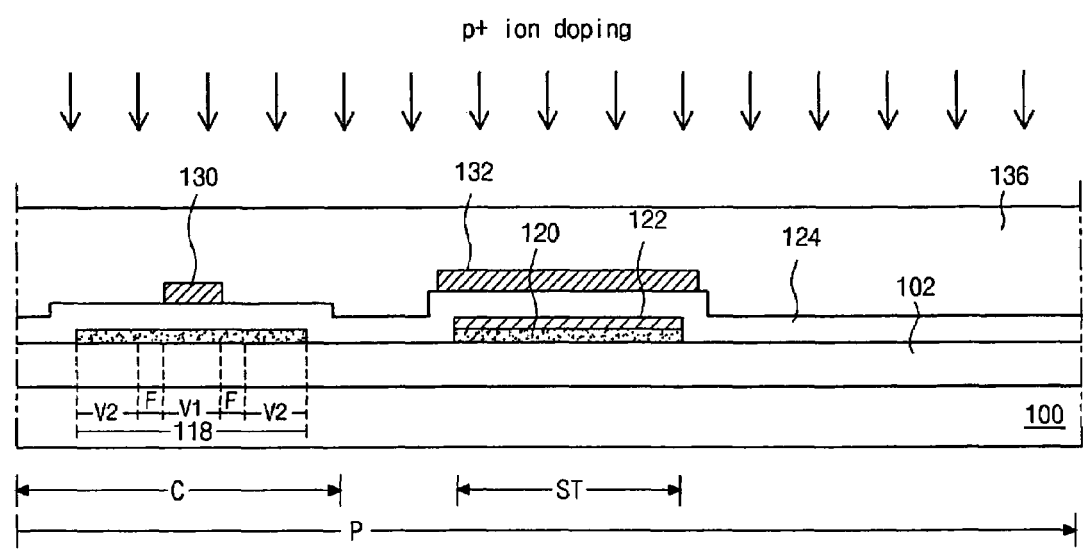
FIG. 22B is a cross-sectional view along line XIV-XIV of FIG. 13 illustrating the formation of a photoresist pattern in a pixel region of the array substrate of FIG. 13 during the fourth mask process.

FIG. 22A is a cross-sectional view of the formation of a photoresist pattern in a driving region of the array substrate of FIG. 13 during a fourth mask process. FIG. 22B is a cross-sectional view along line XIV-XIV of FIG. 13 illustrating the formation of a photoresist pattern in a pixel region of the array substrate of FIG. 13 during the fourth mask process. Referring to FIGS. 22A and 22B, a photoresist material is coated on the entire surface of the substrate 100 where $n^-$ ion doping was performed. The photoresist material is patterned through a fourth mask process to form an eighth photoresist pattern 136. The eighth photoresist pattern 136 covers the first driving region A and the pixel region P and exposes the second driving region B.

Subsequently, $p^+$ ion doping is performed on the entire surface of the substrate 100 including the eighth photoresist pattern 136 thereon, and p-type ions are heavily doped in the doped portions V2 of the second active pattern 116. Although the n-type ions are doped in the doped portions V2 of the second active pattern 116, there is no influence of the n-type ions because the concentration of the p-type ions is extremely high compared to the n-type ions.

Figure 23A:
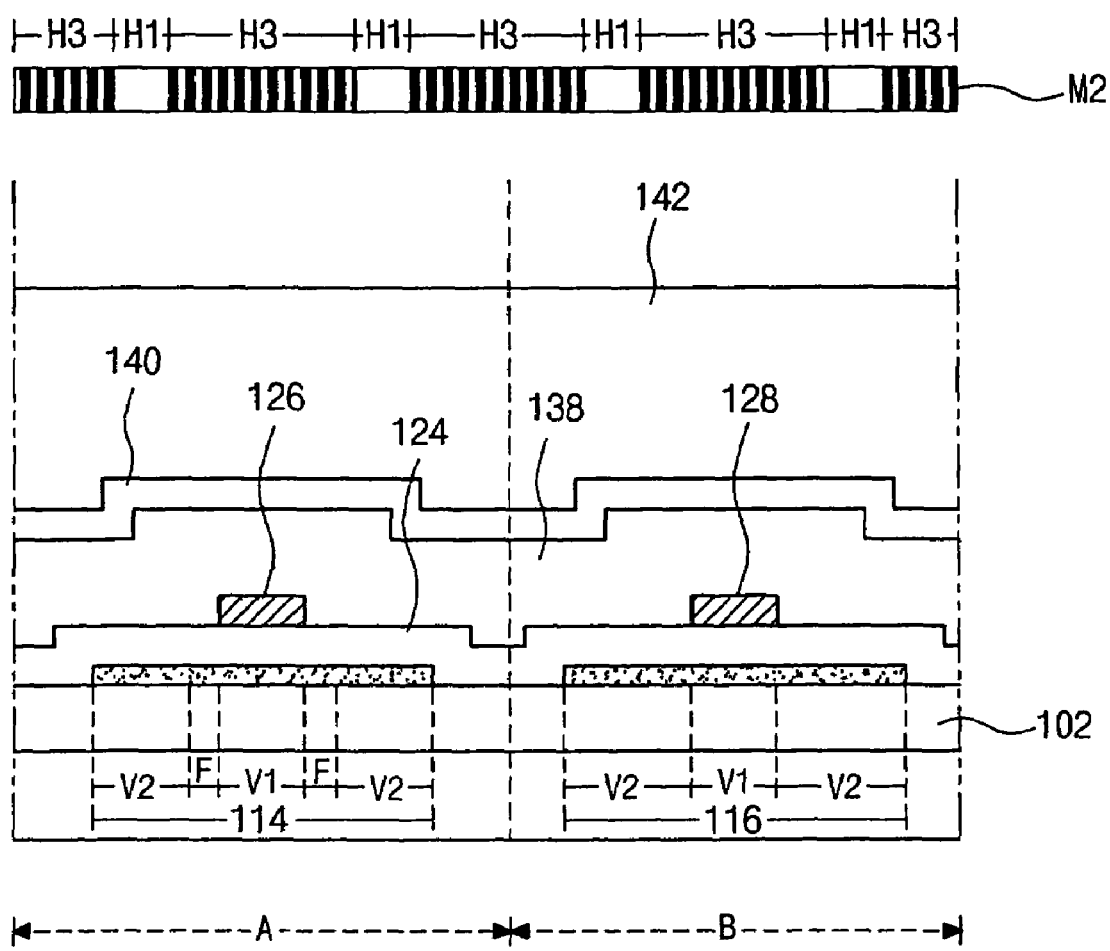
FIGS. 23A and 24A are cross-sectional views of the formation of a photoresist pattern in a driving region of the array substrate of FIG. 13 during a fifth mask process.
Figure 23B:
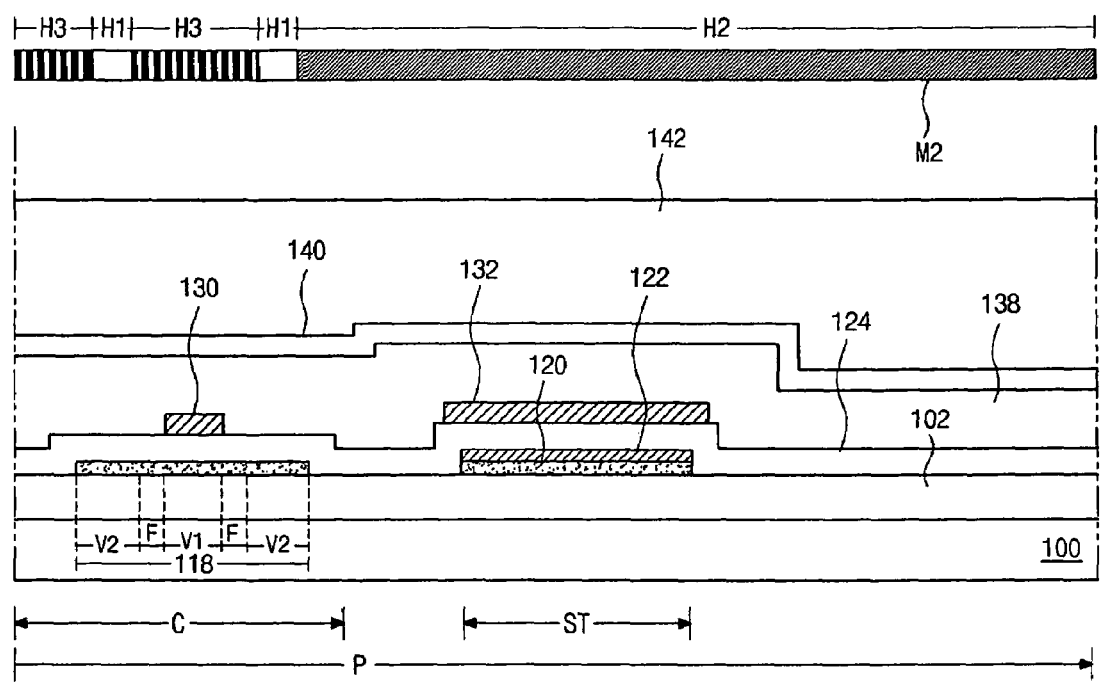
FIGS. 23B and 24B are cross-sectional views along line XIV-XIV of FIG. 13 illustrating the formation of a photoresist pattern in a pixel region of the array substrate of FIG. 13 during the fifth mask process.
Figure 24A:
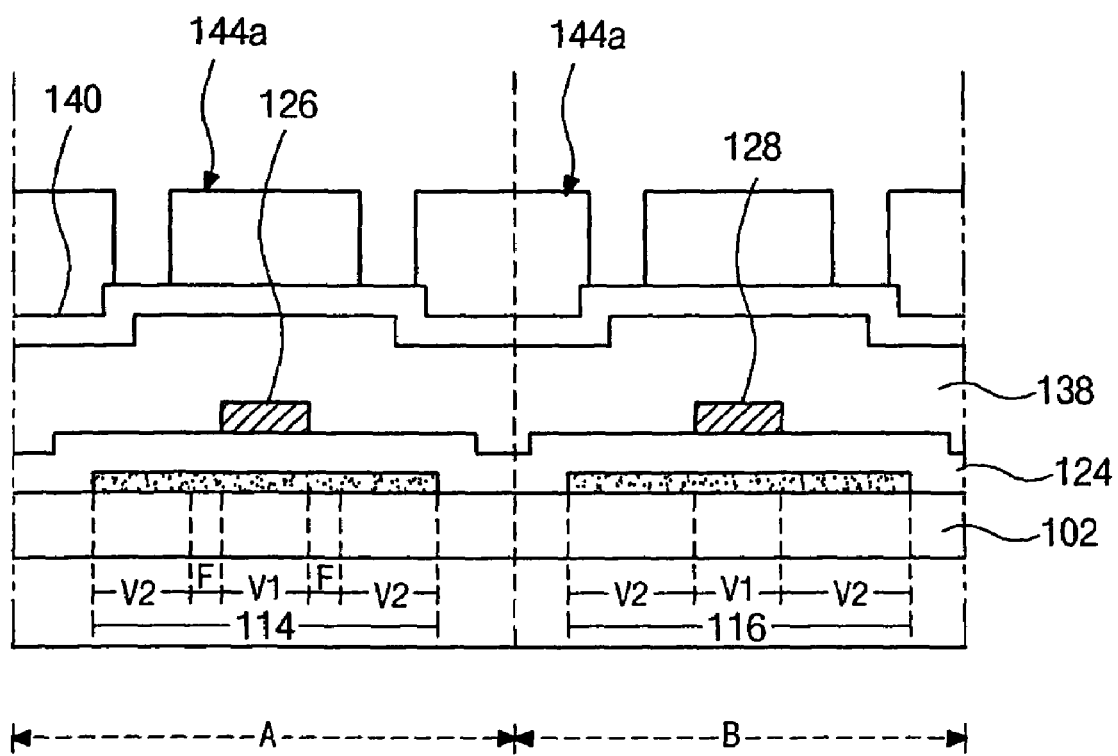
Figure 24B:
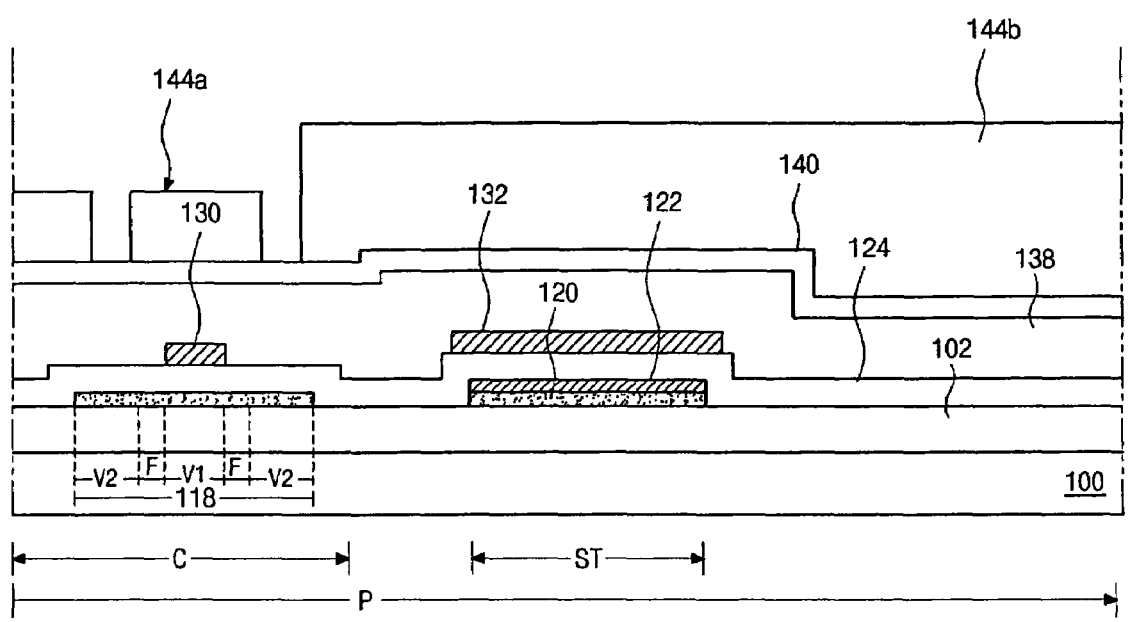

FIGS. 23A and 24A are cross-sectional views of the formation of a photoresist pattern in a driving region of the array substrate of FIG. 13 during a fifth mask process. FIGS. 23B and 24B are cross-sectional views along line XIV-XIV of FIG. 13 illustrating the formation of a photoresist pattern in a pixel region of the array substrate of FIG. 13 during the fifth mask process. Referring to FIGS. 23A and 23B, the eighth photoresist pattern 136 shown in FIGS. 22A and 22B is removed. An inter insulating layer 138 and a transparent conductive layer 140 are sequentially formed on the entire surface of the substrate 100 where p+ ion doping is performed, including the first, second and third gate electrodes 126, 128 and 130, and the storage line 132. The inter insulating layer 138 is formed of an inorganic insulating material, such as silicon nitride ($SiN_x$) or silicon oxide ($SiO_2$). The transparent conductive layer 140 is formed of a transparent conductive material, such as indium tin oxide (ITO) or indium zinc oxide (IZO).

A photoresist layer 142 is formed on the transparent conductive layer 140 by coating a photoresist material. A mask M2 is disposed over the photoresist layer 142. The mask M2 includes a transmitting portion H1, a blocking portion H2 and a half transmitting portion H3. The transmitting portion H1 corresponds to the doped portions V2 of the first, second and third active patterns 114, 116 and 118. The blocking portion H2 corresponds to the pixel region P, and the half transmitting portion H3 corresponds to the other regions. The photoresist layer 142 is exposed to light through the mask M2 and developed. Accordingly, as illustrated in FIGS. 24A and 24B, ninth and tenth photoresist patterns 144a and 144b are formed. The ninth photoresist pattern 144a is disposed in the first driving region A, the second driving region B, and the switching region C, and exposes portions of the transparent conductive layer 140 corresponding to the doped portions V2 of the first, second and third active patterns 114, 116 and 118. The tenth photoresist pattern 144b is disposed in the pixel region P excluding the switching region C. The tenth photoresist pattern 144b is thicker than the ninth photoresist pattern 144a.

Figure 25A:
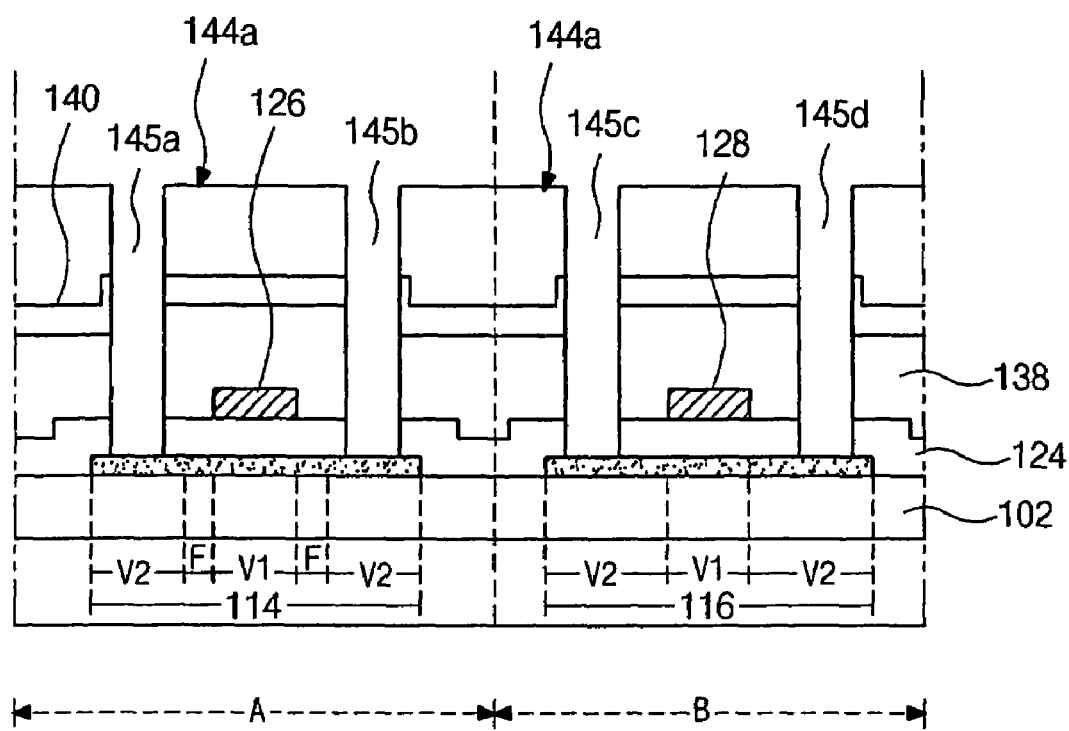
FIG. 25A is a cross-sectional view of the formation of a plurality of contact holes in a driving region of the array substrate of FIG. 13 during the fifth mask process.
Figure 25B:
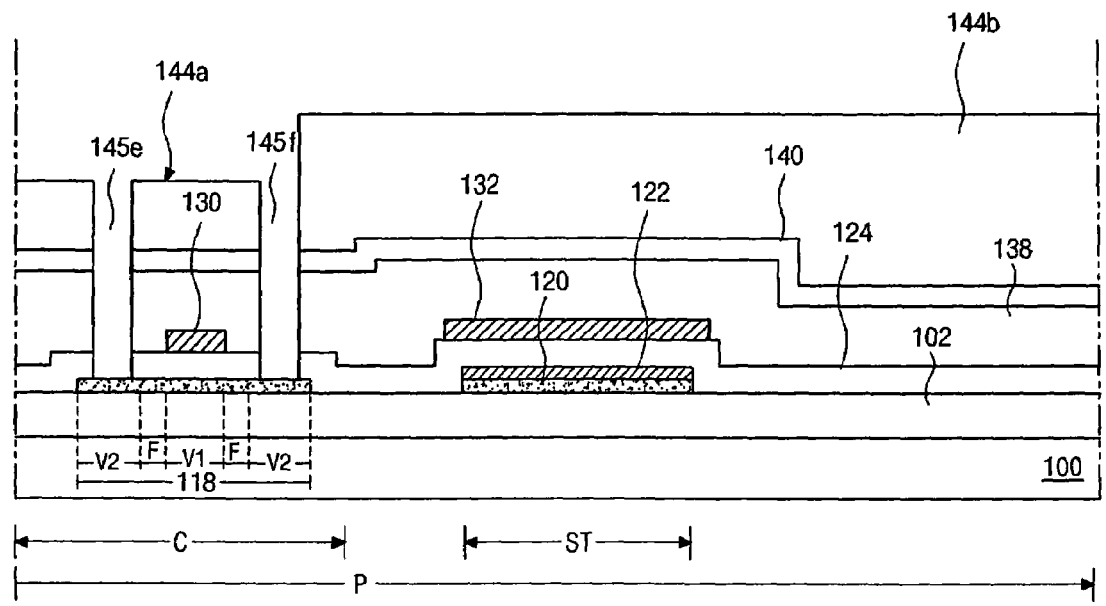
FIG. 25B is a cross-sectional view along line XIV-XIV of FIG. 13 illustrating the formation of a plurality of contact holes in a pixel region of the array substrate of FIG. 13 during the fifth mask process.

FIG. 25A is a cross-sectional view of the formation of a plurality of contact holes in a driving region of the array substrate of FIG. 13 during the fifth mask process. FIG. 25B is a cross-sectional view along line XIV-XIV of FIG. 13 illustrating the formation of a plurality of contact holes in a pixel region of the array substrate of FIG. 13 during the fifth mask process. Referring to FIGS. 25A and 25B, the exposed portions of the transparent conductive layer 140, and the inter insulating layer 138 and the gate insulating layer 124 underneath, are sequentially removed. Thereby, first, second, third, fourth, fifth and sixth contact holes 145a, 145b, 145c, 145d, 145e and 145f are formed. The contact holes 145a, 145b, 145c, 145d, 145e and 145f expose the doped portions V2 of the first, second and third active patterns 114, 116 and 118. Although not shown, a contact hole is also formed through the fifth mask process to expose the metal pattern 122.

Figure 26A:
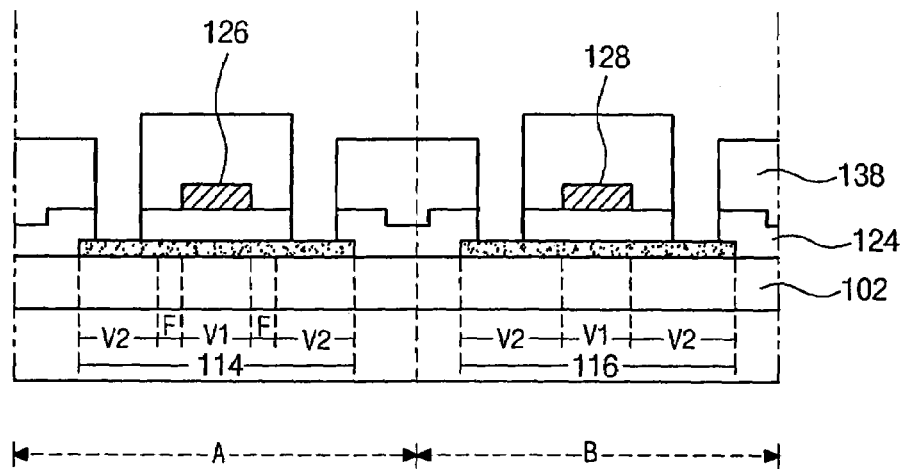
FIG. 26A is a cross-sectional view of an ashing process performed in a driving region of the array substrate of FIG. 13 during the fifth mask process.
Figure 26B:
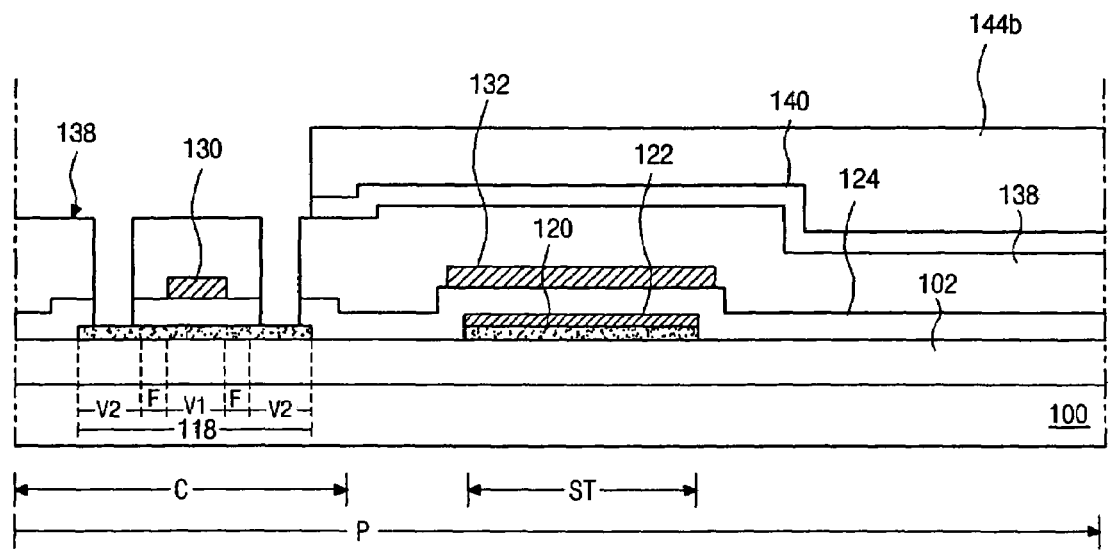
FIG. 26B is a cross-sectional view along line XIV-XIV of FIG. 13 illustrating an ashing process performed in a pixel region of the array substrate of FIG. 13 during the fifth mask process.

FIG. 26A is a cross-sectional view of an ashing process performed in a driving region of the array substrate of FIG. 13 during the fifth mask process. FIG. 26B is a cross-sectional view along line XIV-XIV of FIG. 13 illustrating an ashing process performed in a pixel region of the array substrate of FIG. 13 during the fifth mask process. Referring to FIGS. 26A and 26B, the ninth photoresist pattern 144a of FIGS. 25A and 25B is removed through an ashing process, and the transparent conductive layer 140 of FIGS. 25A and 25B is exposed in the first driving region A, the second driving region B and the switching region C. The thickness of the tenth photoresist pattern 144b is reduced, and an edge of the tenth photoresist pattern 144b is removed. Then, the exposed transparent conductive layer 140 of FIGS. 25A and 25B is removed to thereby expose the inter insulating layer 138 in the first driving region A, the second driving region B and the switching region C.

Figure 27A:
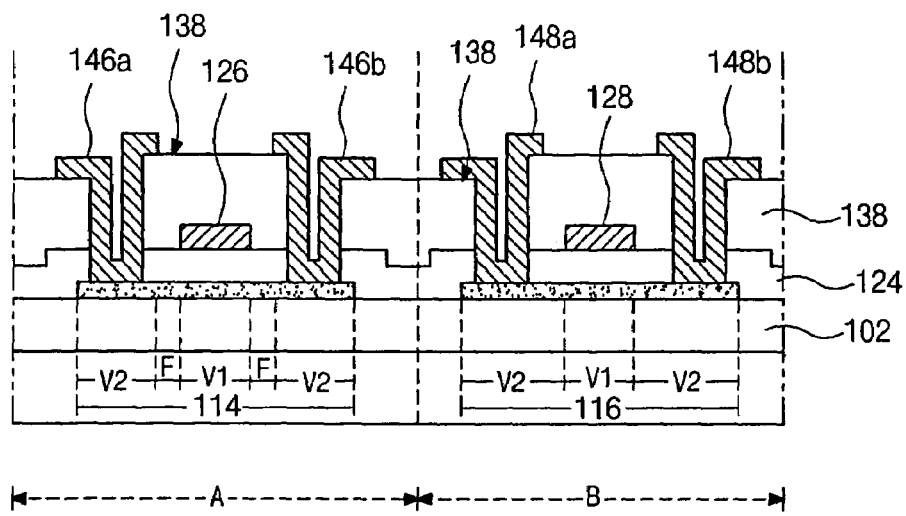
FIG. 27A is a cross-sectional view of the formation of a plurality of electrodes in a driving region of the array substrate of FIG. 13 during a sixth mask process.
Figure 27B:
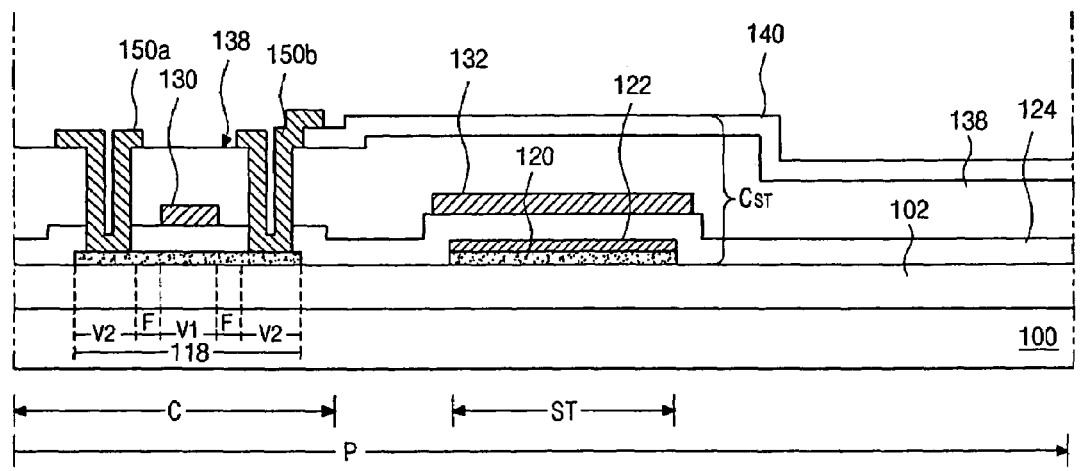
FIG. 27B is a cross-sectional view along line XIV-XIV of FIG. 13 illustrating the formation of a plurality of electrodes in a pixel region of the array substrate of FIG. 13 during the sixth mask process.

FIG. 27A is a cross-sectional view of the formation of a plurality of electrodes in a driving region of the array substrate of FIG. 13 during a sixth mask process. FIG. 27B is a cross-sectional view along line XIV-XIV of FIG. 13 illustrating the formation of a plurality of electrodes in a pixel region of the array substrate of FIG. 13 during the sixth mask process. Referring to FIGS. 27A and 27B, the tenth photoresist pattern 144b (shown in FIG. 26B) is removed, exposing the transparent conductive layer 140 in the pixel region P. The exposed transparent conductive layer 140 becomes a pixel electrode 140. First source and drain electrodes 146a and 146b, second source and drain electrodes 148a and 148b, and third source and drain electrodes 150a and 150b are formed on the substrate 100 including the pixel electrode 140 thereon by sequentially depositing and patterning a metallic material through a sixth mask process. The metallic material can be, for example, chromium (Cr), molybdenum (Mo), tungsten (W), titanium (Ti), aluminum (Al), an aluminum alloy such as AlNd, or copper (Cu).

The first source and drain electrodes 146a and 146b contact the doped portions V2 of the first active pattern 114 through the first and second contact holes 145a and 145b, respectively. The second source and drain electrodes 148a and 148b contact the doped portions V2 of the second active pattern 116 through the third and fourth contact holes 145c and 145d, respectively. The third source and drain electrodes 150a and 150b contact the doped portions V2 of the third active pattern 118 through the fifth and sixth contact holes 145e and 145f, respectively. The third drain electrode 150b contacts the pixel electrode 140. Although not shown, the third drain electrode 150b also contacts the metal pattern 122. Thus, the metal pattern 122, the storage line 132 and the pixel electrode 140 function as first, second and third electrodes to form a storage capacitor $C_{ST}$. In this embodiment of the present invention, the storage capacitor $C_{ST}$ includes two parallel capacitors. In this embodiment of the present invention, the array substrate including the driver ICs is manufactured through six-mask processes.

Figure 28A:
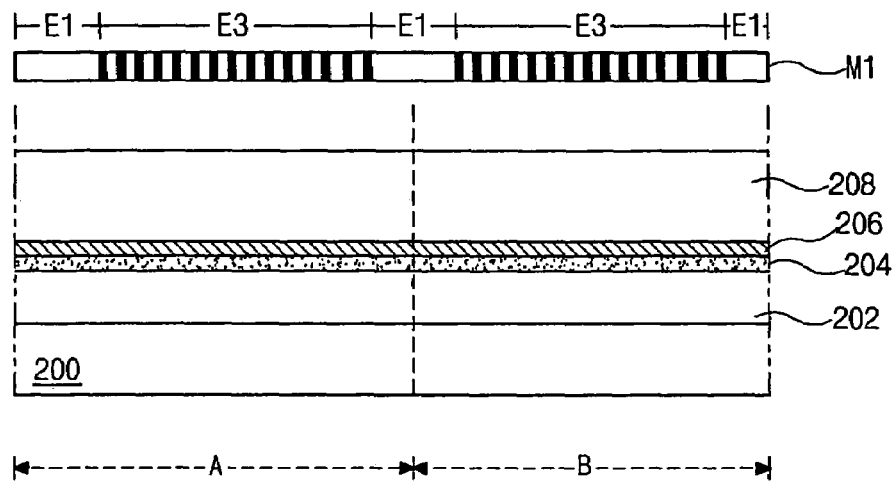
Figure 28B:
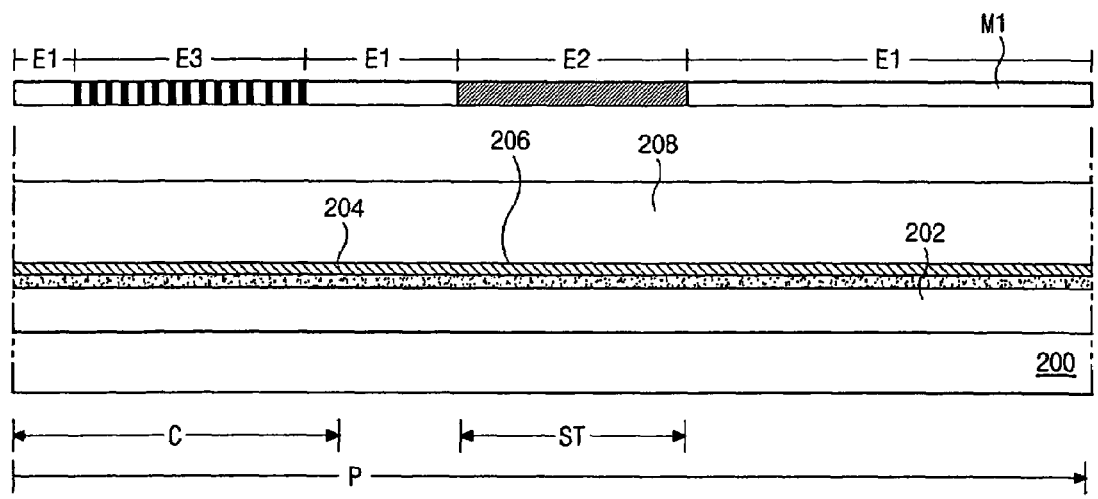

FIG. 28A is a cross-sectional view illustrating the formation of a metal layer in a driving region of an array substrate using a first mask process in accordance with another embodiment of the present invention. FIG. 28B is a cross-sectional view illustrating the formation of a metal layer in a pixel region of the array substrate of FIG. 13 during the first mask process. Referring to FIG. 28A, a first driving region A and a second driving region B are defined on a substrate 200. Referring to FIG. 28B, a pixel region P, which includes a switching region C and a storage region ST, is defined on the substrate 200. A buffer layer 202 is formed on the substrate 200, including the first and second driving regions A and B, and the pixel region P, by depositing, for example, silicon nitride ($SiN_x$) or silicon oxide ($SiO_2$). A polycrystalline silicon layer 204 and a metal layer 206 are formed on the buffer layer 202. The polycrystalline silicon layer 204 may be formed by sequentially depositing, dehydrogenating, and crystallizing amorphous silicon (a-Si:H).

Next, a photoresist layer 208 is formed on the metal layer 206 by coating a photoresist material. A mask M1 is disposed over the photoresist layer 208. The mask M1 includes a transmitting portion E1, a blocking portion E2 and a half transmitting portion E3. The half transmitting portion E3 may include a semitransparent film or slits. The half transmitting portion E3 corresponds to the first driving region A, the second driving region B and the switching region C. The blocking portion E2 corresponds to the storage region ST, and the transmitting portion E1 corresponds to the other regions. The photoresist layer 208 is exposed to light through the mask M1. Then, the photoresist layer 208 is developed.

Figure 29A:
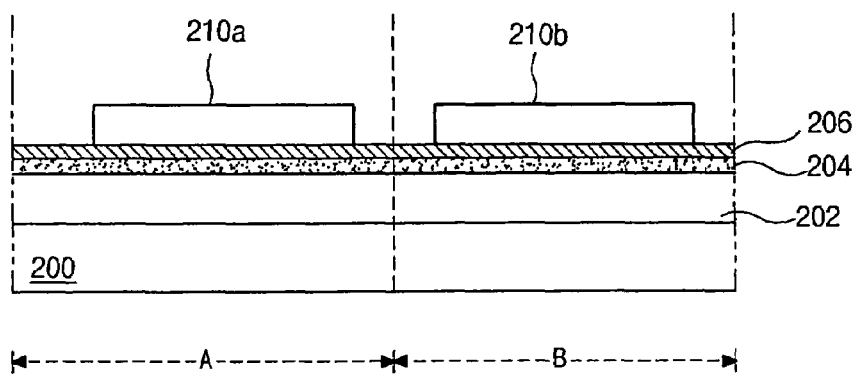
Figure 29B:
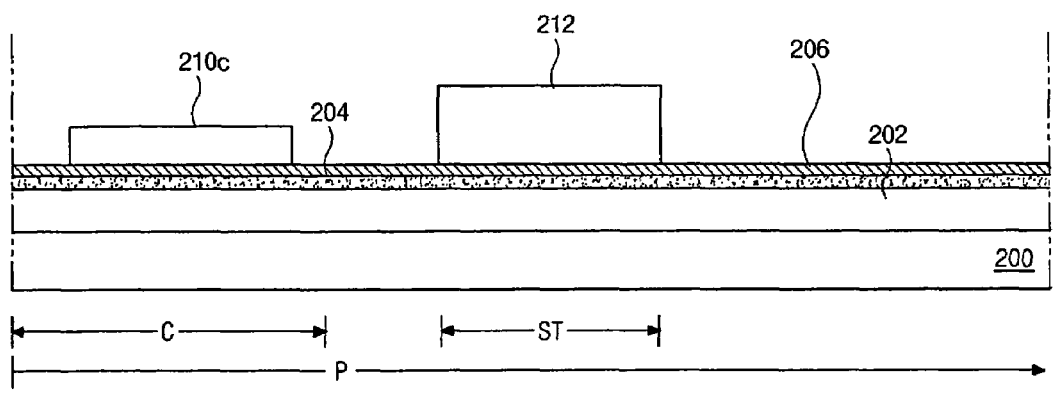

FIG. 29A is a cross-sectional view of the formation of a photoresist pattern in a driving region of an array substrate during the first mask process. FIG. 29B is a cross-sectional view illustrating the formation of a photoresist pattern in a pixel region of the array substrate during the first mask process. Referring to FIGS. 29A and 29B, first, second, third and fourth photoresist patterns 210a, 210b, 210c and 212 are formed. The first, second, and third photoresist patterns 210a, 210b and 210c are formed in the first driving region A, the second driving region B and the switching region C, respectively. The first, second, and third photoresist patterns 210a, 210b and 210c have a first thickness. The fourth photoresist pattern 212 is formed in the storage region ST and is thicker than the first to third photoresist patterns 210a, 210b and 210c. The first to fourth photoresist patterns 210a, 210b, 210c, and 212 expose portions of the metal layer 206 in the pixel region P and the first and second driving regions A and B.

Figure 30A:
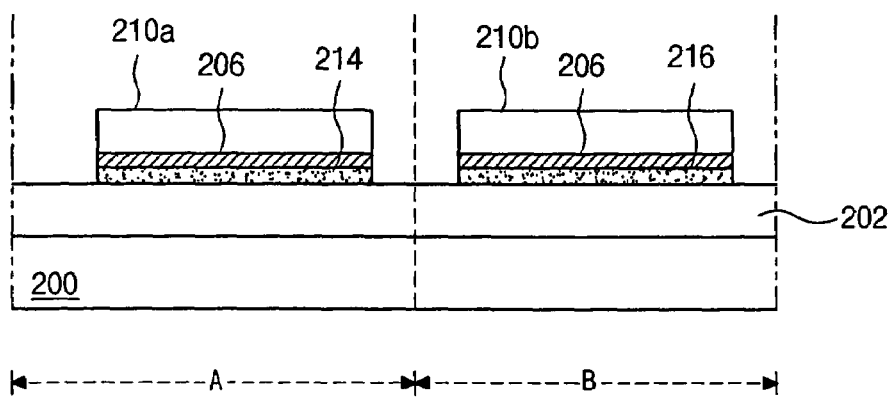
Figure 30B:
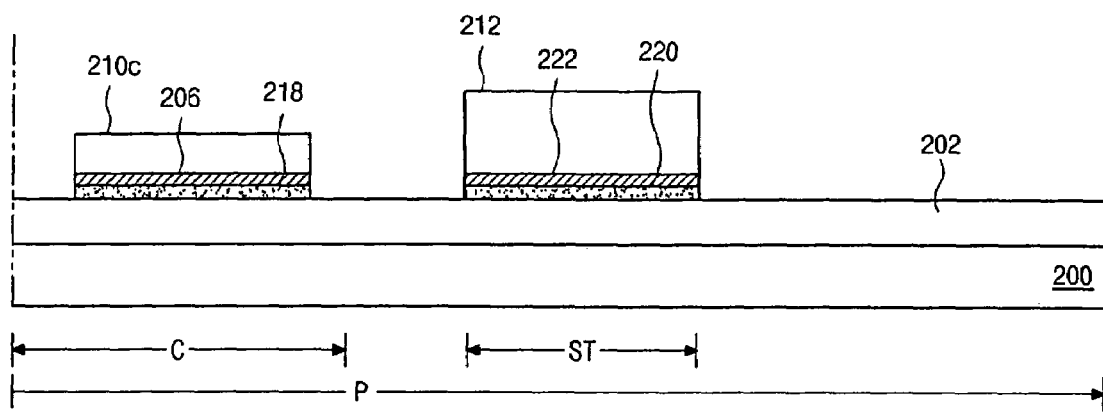

FIG. 30A is a cross-sectional view of the formation of a metal pattern in a driving region of an array substrate during the first mask process. FIG. 30B is a cross-sectional view illustrating the formation of a metal pattern in a pixel region of the array substrate of FIG. 13 during the first mask process. Referring to FIGS. 30A and 30B, the exposed portions of the metal layer 206 and the polycrystalline silicon layer 204 thereunder are removed. The metal layer 206 may be removed by a wet etch method. The polycrystalline silicon layer 204 may be removed by a dry etch method. The remaining pattern on the buffer layer 202 in the first driving region A includes a polycrystalline silicon patterned layer 214, a metal patterned layer 206, and the photoresist pattern 210a in stacking order. The remaining pattern on the buffer layer 202 in the second driving region B includes a polycrystalline silicon patterned layer 216, a metal patterned layer 206, and the photoresist pattern 210b in stacking order. The remaining pattern on the buffer layer 202 in the switching region C of the pixel region includes a polycrystalline silicon patterned layer 218, a metal patterned layer 206, and the photoresist pattern 210c in stacking order. The remaining pattern on the buffer layer 202 in the storage region ST of the pixel region includes a polycrystalline silicon patterned layer 220, a metal patterned layer 222, and the photoresist pattern 212 in stacking order.

Figure 31A:
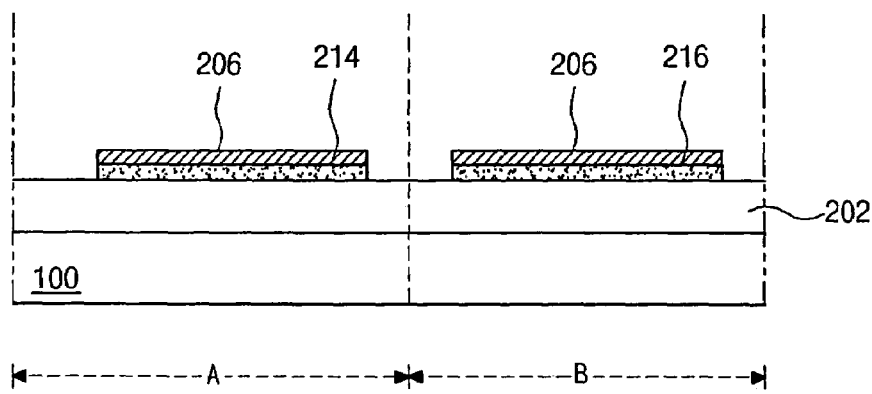
Figure 31B:
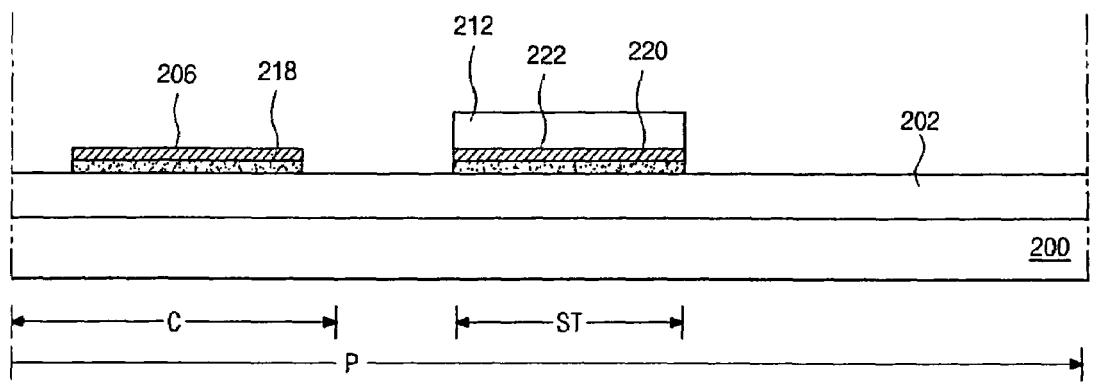

FIG. 31A is a cross-sectional view of an ashing of a photoresist pattern in a driving region of an array substrate during the first mask process. FIG. 31B is a cross-sectional view illustrating an ashing of a photoresist pattern in a pixel region of the array substrate of FIG. 13 during the first mask process. Referring to FIGS. 31A and 31B, an ashing process is performed. The first, second and third photoresist patterns 210a, 210b and 210c from FIGS. 30A and 30B are removed by the ashing process, thereby exposing the metal layer 206 in the first driving region A, the second driving region B and the switching region C. The thickness of the fourth photoresist pattern 212 is also reduced by the ashing process.

Figure 32A:
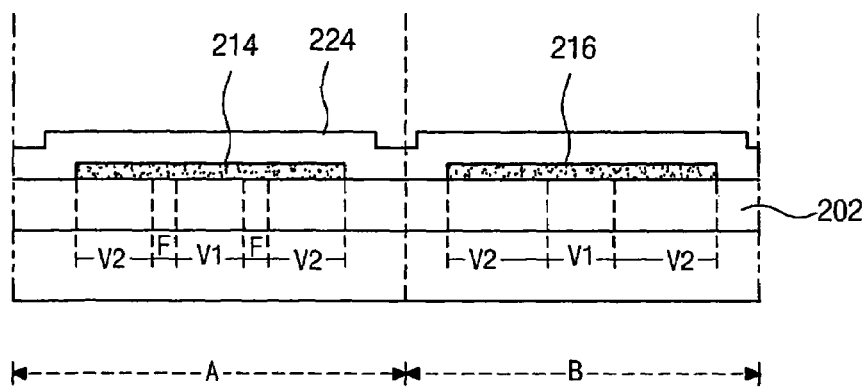
Figure 32B:
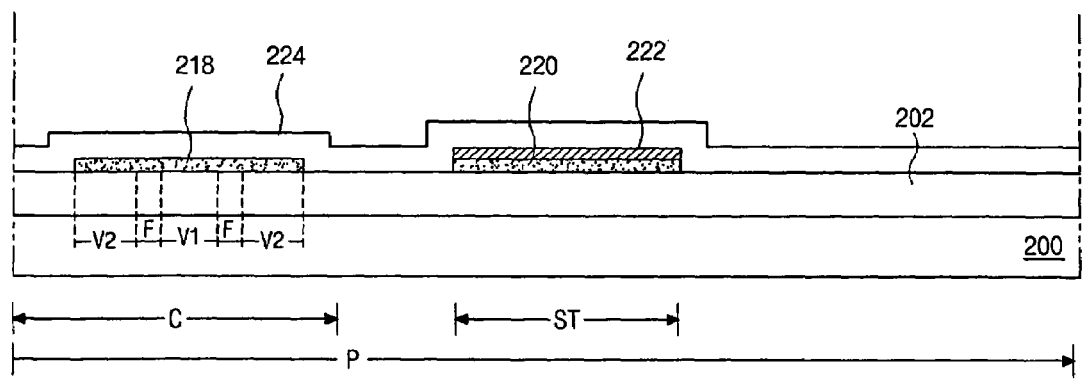

FIG. 32A is a cross-sectional view of the formation of a gate insulating layer in a driving region of an array substrate following the first mask process. FIG. 32B is a cross-sectional view illustrating the formation of a gate insulating layer in a pixel region of the array substrate of FIG. 13 following the first mask process. Referring to FIGS. 32A and 32B, the exposed metal layer 206 is removed from the first and second driving regions A and B and the switching region C, and the fourth photoresist pattern 212 is removed from the storage region ST. First, second, and third active patterns 214, 216, and 218 are formed on the buffer layer 202 in the first driving region A, the second driving region B, and the switching region C, respectively. An extension portion 220 and a metal pattern 222 are formed on the buffer layer 202 in the storage region ST. The extension portion 220 extends from the third active pattern 218, and the metal pattern 222 is disposed on the extension portion 220. Each of the first, second and third active patterns 214, 216 and 218 includes an intrinsic portion V1 and doped portions V2 at both sides of the intrinsic portion V1. The first and third active patterns 214 and 218 further include a lightly doped drain (LDD) portion F between the intrinsic portion V1 and each doped portion V2. Then, a gate insulating layer 224 is formed on the entire surface of the substrate 200 covering the first, second and third active patterns 214, 216 and 218, the extension portion 220 and the metal pattern 222 thereon. The gate insulating layer 224 may be formed of an inorganic insulating material such as silicon nitride ($SiN_x$) or silicon oxide ($SiO_2$).

Figure 33A:
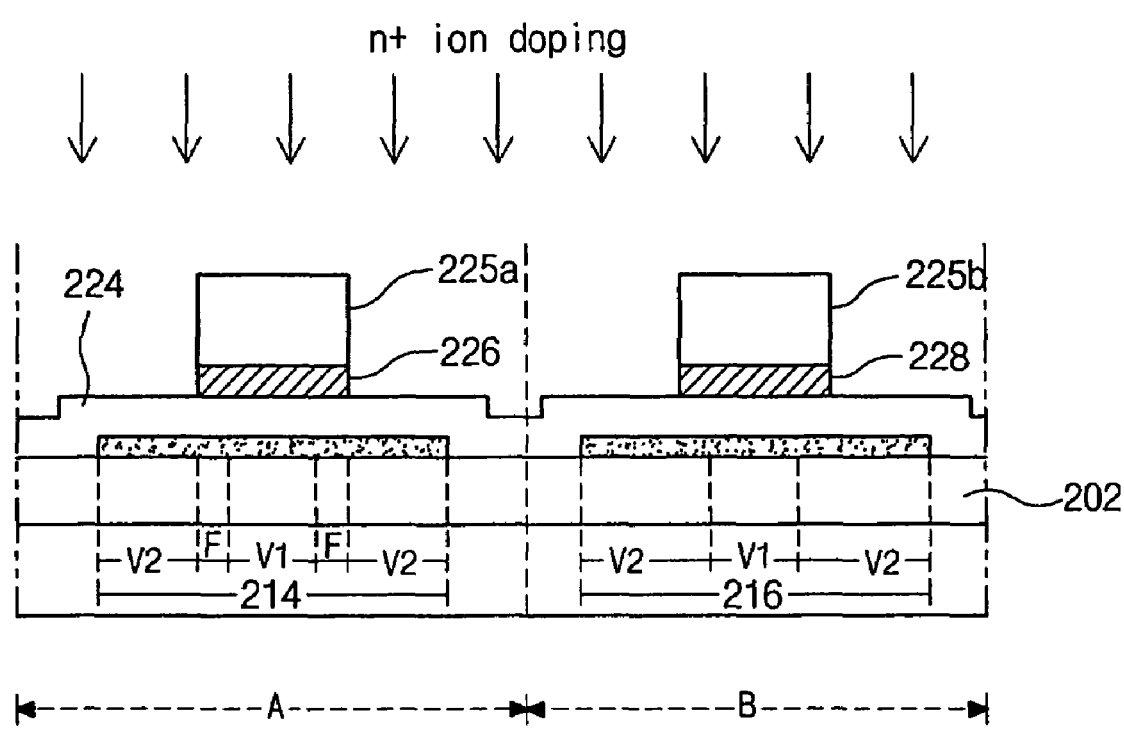
Figure 33B:
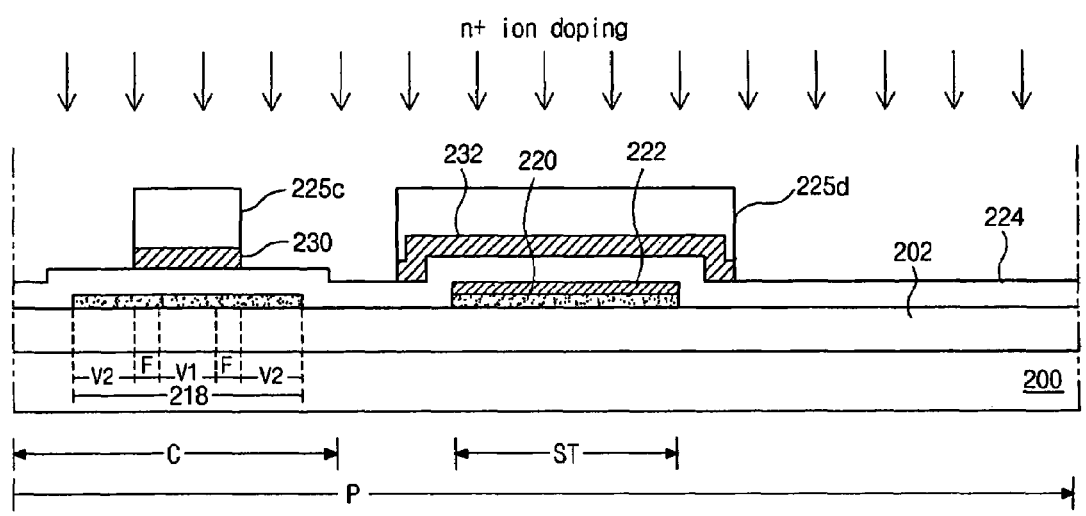

FIG. 33A is a cross-sectional view of the formation of a plurality of electrodes in a driving region of an array substrate during a second mask process. FIG. 33B is a cross-sectional view illustrating the formation of an electrode and a storage line in a pixel region of the array substrate during the second mask process. Referring to FIGS. 33A and 33B, a metallic material (not shown) is deposited on the gate insulating layer 224. Next, photoresist is coated on the metallic material and then is patterned through a second mask process to thereby form fifth, sixth, seventh and eighth photoresist patterns 225a, 225b, 225c and 225d. The metallic material is etched by using the fifth, sixth, seventh and eighth photoresist patterns 225a, 225b, 225c and 225d. Thus, first, second and third gate electrodes 226, 228 and 230 and a storage line 232 are formed on the gate insulating layer 224. The metallic material may include aluminum (Al), an aluminum alloy (AlNd), copper (Cu), molybdenum (Mo), tungsten (W) or chromium (Cr). The first, second and third gate electrodes 226, 228 and 230 correspond to the intrinsic portions V1 of the first, second and third active patterns 214, 216 and 218, respectively. The first and third gate electrodes 226 and 230 also cover the LDD portions F of the first and third active patterns 214 and 218. The second gate electrode 228 partially covers the doped portions V2 of the second active pattern 216. The storage line 232 is disposed over the metal pattern 222 in the storage region ST. The storage line 232 may cross the pixel region P similarly to the storage line 132 in FIG. 13. Concurrently, a gate line GL (shown in FIG. 13) is formed and is connected to the third gate electrode 230 in the switching region C.

Next, $n^+$ ion doping is performed on the entire surface of the substrate 200 including the fifth, sixth, seventh and eighth photoresist patterns 225a, 225b, 225c and 225d. Therefore, n-type ions are heavily doped in the doped portions V2 of the first and third active patterns 214 and 218 and in parts of the doped portions V2 of the second active pattern 216.

Figure 34A:
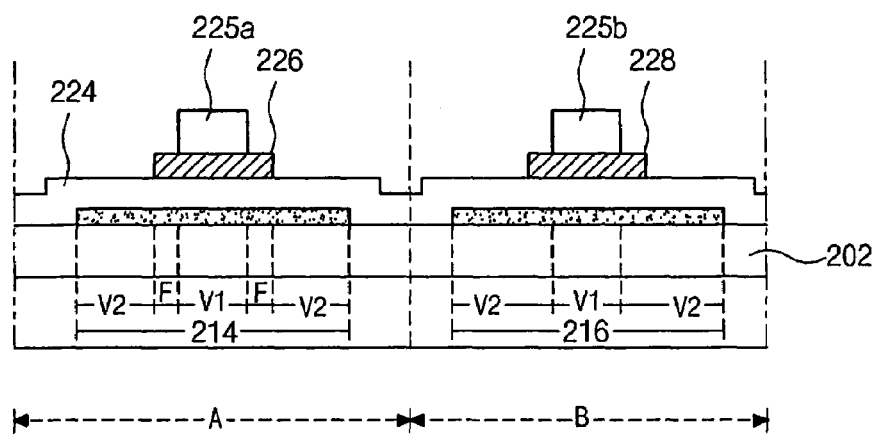
Figure 34B:
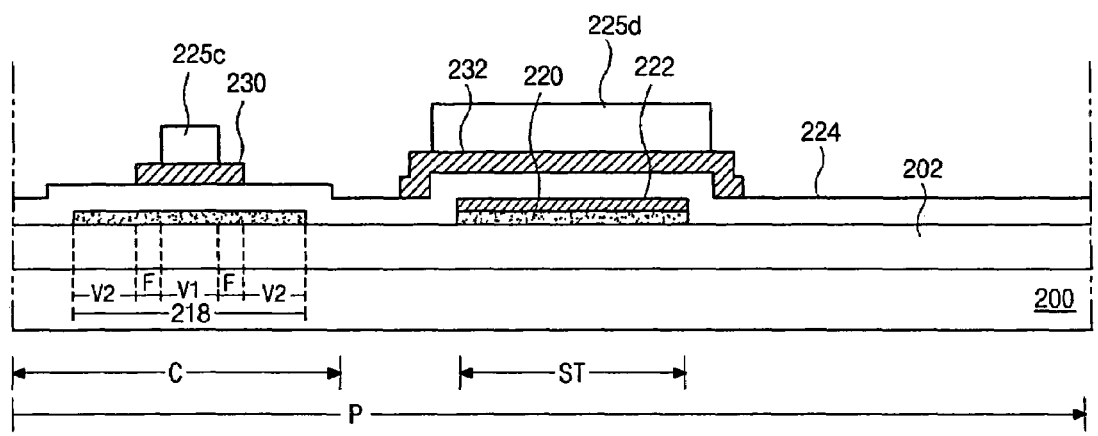

Referring to FIGS. 34A and 34B, the fifth and seventh photoresist patterns 225a and 225c are partially removed by performing an ashing process such that peripheral portions of the first and third gate electrodes 226 and 230 corresponding to the LDD portions F of the first and third active patterns 214 and 218 are exposed. At this time, the sixth and eighth photoresist patterns 225b and 225d are also removed, and peripheral portions of the second gate electrode 228 and the storage line 232 are exposed. The exposed peripheral portions of the second gate electrode 228 and the storage line 232 have the same width as the exposed portions of the first and third gate electrodes 226 and 230.

Figure 35A:
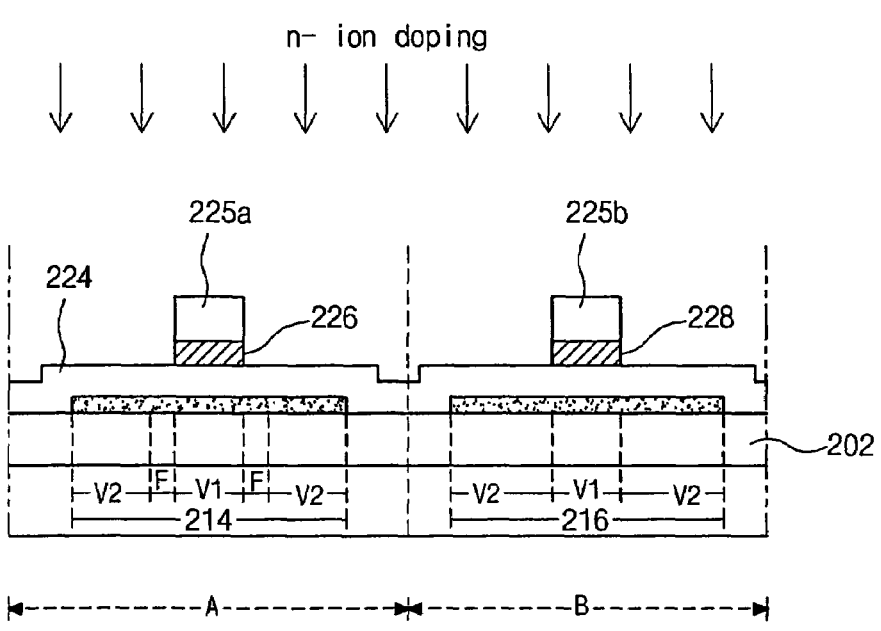
Figure 35B:
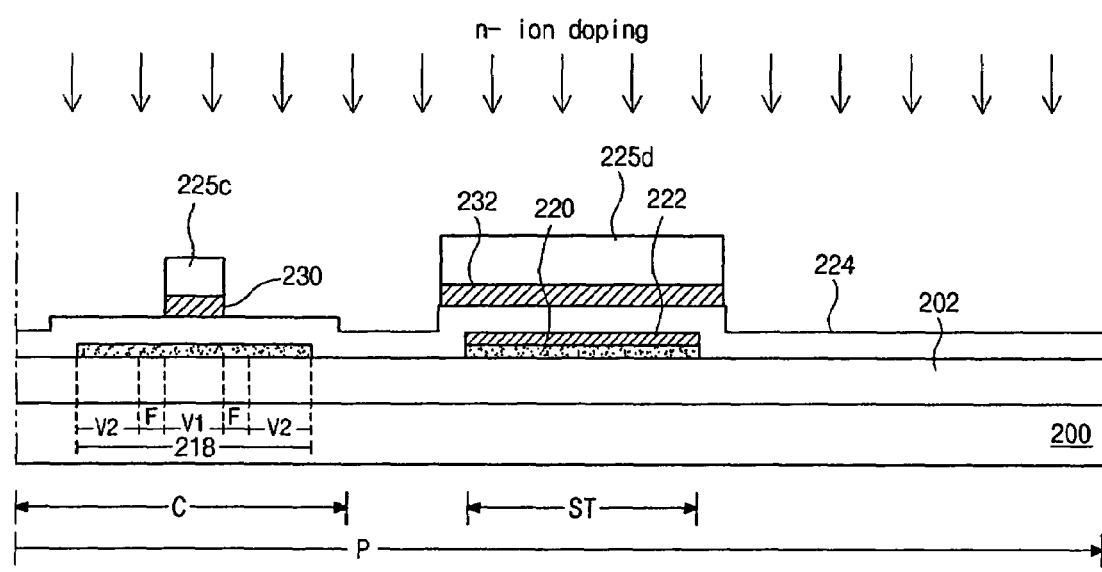

Referring to FIGS. 35A and 35B, the exposed peripheral portions of the first, second and third gate electrodes 226, 228 and 230 and the storage line 232 of FIGS. 34A and 34B are removed. Thus, portions of the gate insulating layer 224 corresponding to the LDD regions F of the first and third active patterns 214 and 218 are exposed. Additionally, portions of the gate insulating layer 224 corresponding to the doped portions V2 of the second active pattern 216 are entirely exposed. The storage line 232 has a reduced width.

Next, n⁻ ion doping is carried out on the entire surface of the substrate 200. Here, the first, second and third gate electrodes 226, 228 and 230 are used as a doping mask. Thus, n-type ions are lightly doped in the LDD portions F of the first and third active patterns 214 and 218 and the doped portions V2 of the first, second and third active patterns 214, 216 and 218. Since n-type ions are heavily doped in the doped portions V2 of the first and third active patterns 214 and 218, n-type ions are more doped in the doped portions V2 of the first and third active patterns 214 and 218 by the n⁻ ion doping. The fifth, sixth, seventh and eighth photoresist patterns 225a, 225b, 225c and 225d are removed.

Figure 36A:
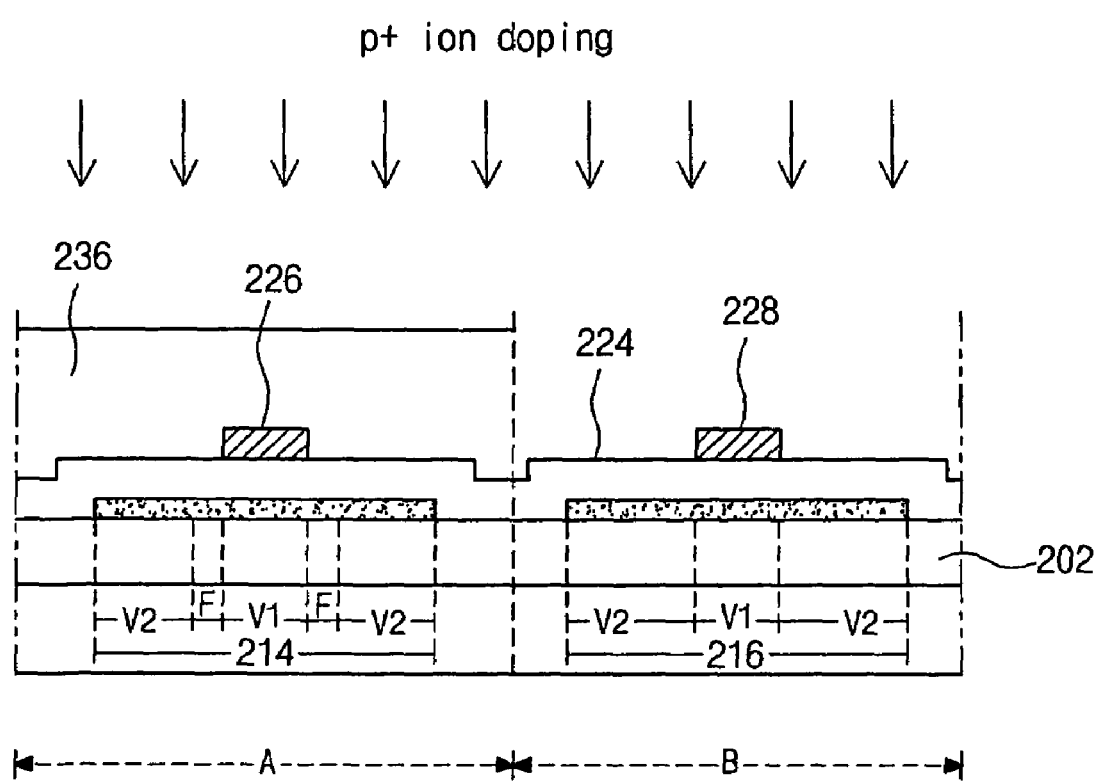
Figure 36B:
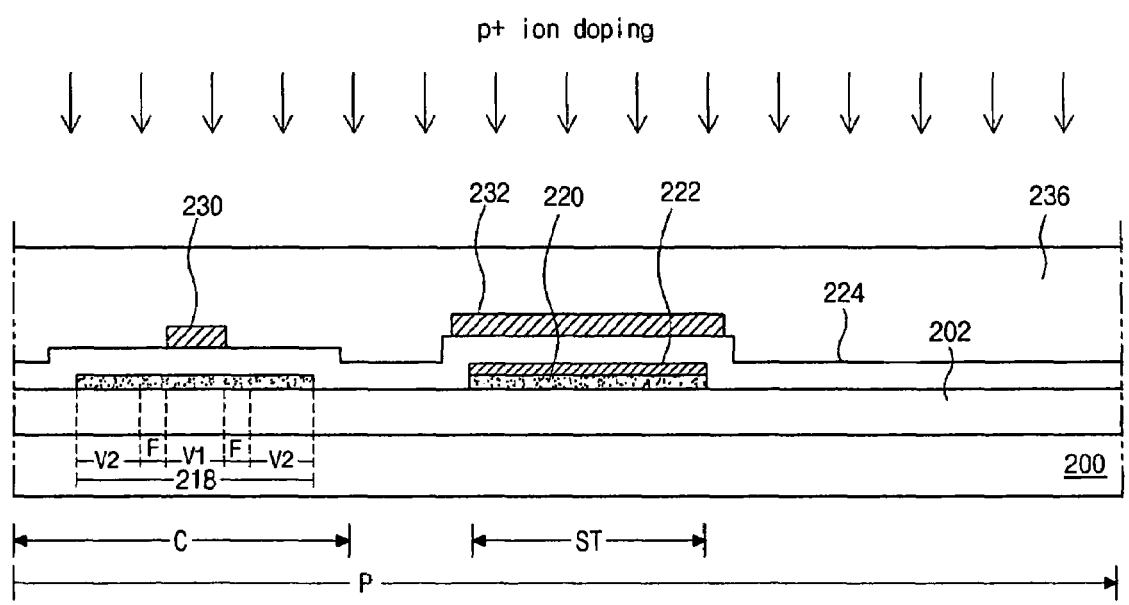

FIG. 36A is a cross-sectional view of the formation of a photoresist pattern in a driving region of an array substrate during a third mask process. FIG. 36B is a cross-sectional view illustrating the formation of a photoresist pattern in a pixel region of the array substrate during the third mask process. Referring to FIGS. 36A and 36B, photoresist is coated on the entire surface of the substrate 200 where n⁻ ion doping is performed. Then, the photoresist is patterned through a third mask process to thereby form a ninth photoresist pattern 236. The ninth photoresist pattern 236 covers the first driving region A and the pixel region P and exposes the second driving region B.

Subsequently, p⁺ ion doping is performed on the entire surface of the substrate 200 including the ninth photoresist pattern 236 thereon, and p-type ions are heavily doped in the doped portions V2 of the second active pattern 216. At this time, a concentration of the p-type ions should be about 2.5 times the concentration of the n-type ions in the n⁺ ion doping. Therefore, although the n-type ions are doped in the doped portions V2 of the second active pattern 216, there is no influence of the n-type ions because the concentration of the p-type ions is higher than the concentration of the n-type ions. Accordingly, through the second and third mask processes, n-type ions are lightly doped in the LDD portions F of the first and the third active patterns 214 and 218; n-type ions are heavily doped in the doped portions V2 of the first and third active patterns 214 and 218; and p-type ions are heavily doped in the doped portions V2 of the second active pattern 216.

Figure 37A:
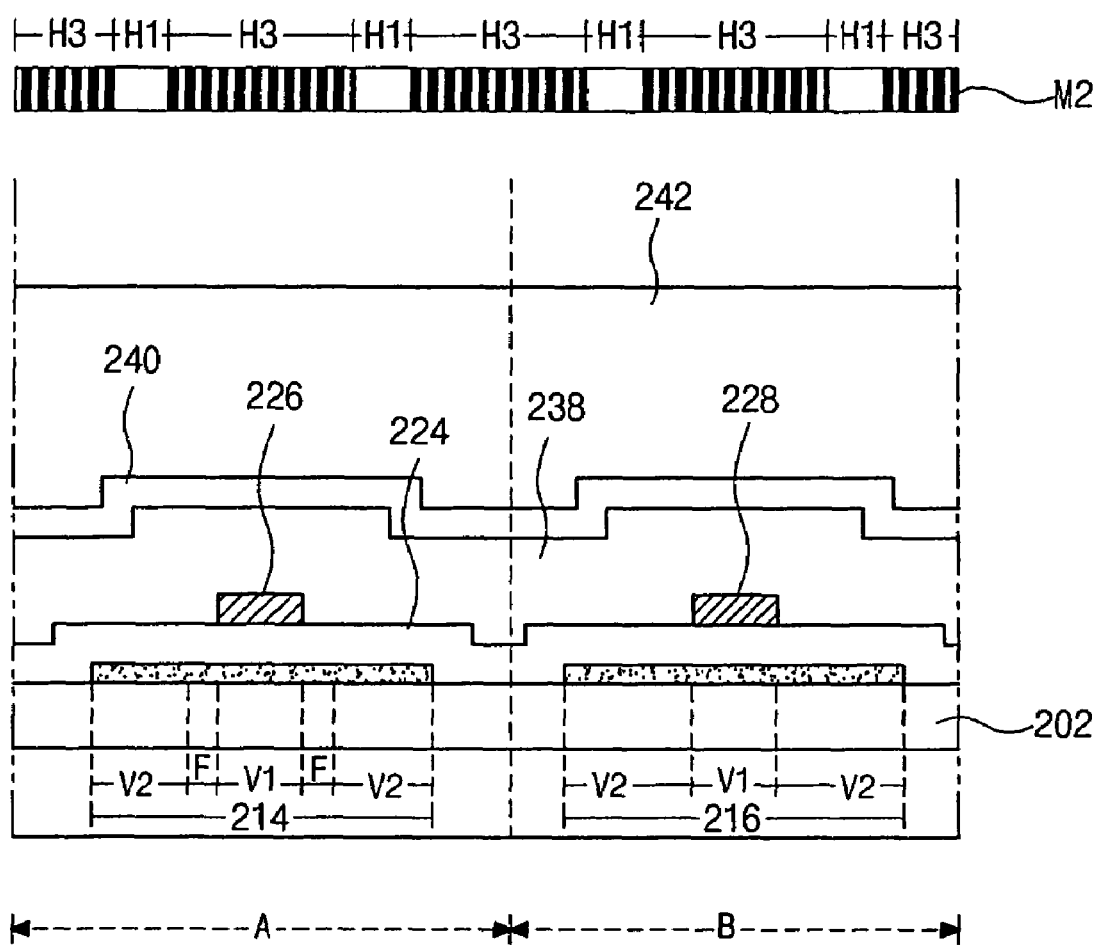
Figure 37B:
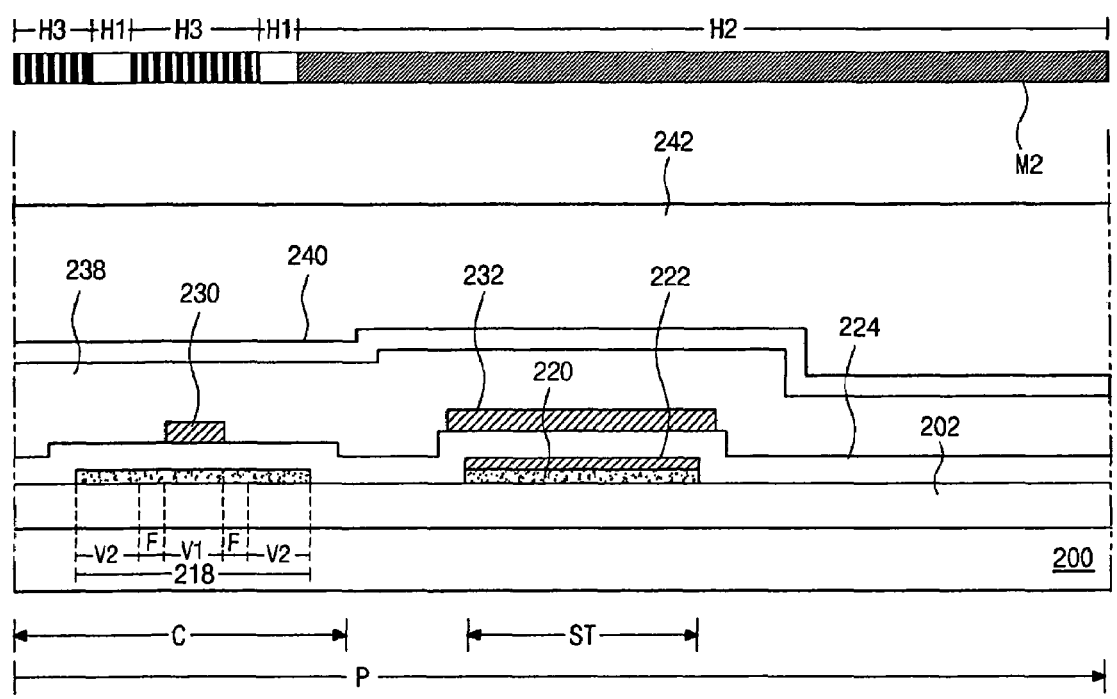
Figure 38A:
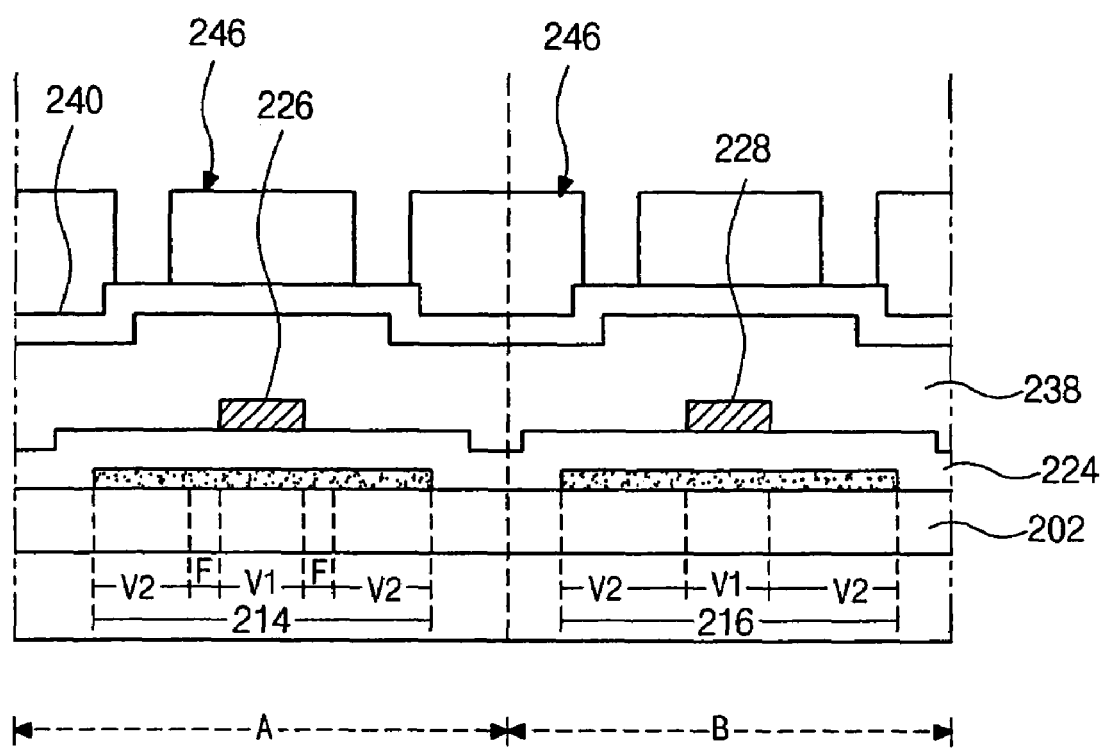
Figure 38B:
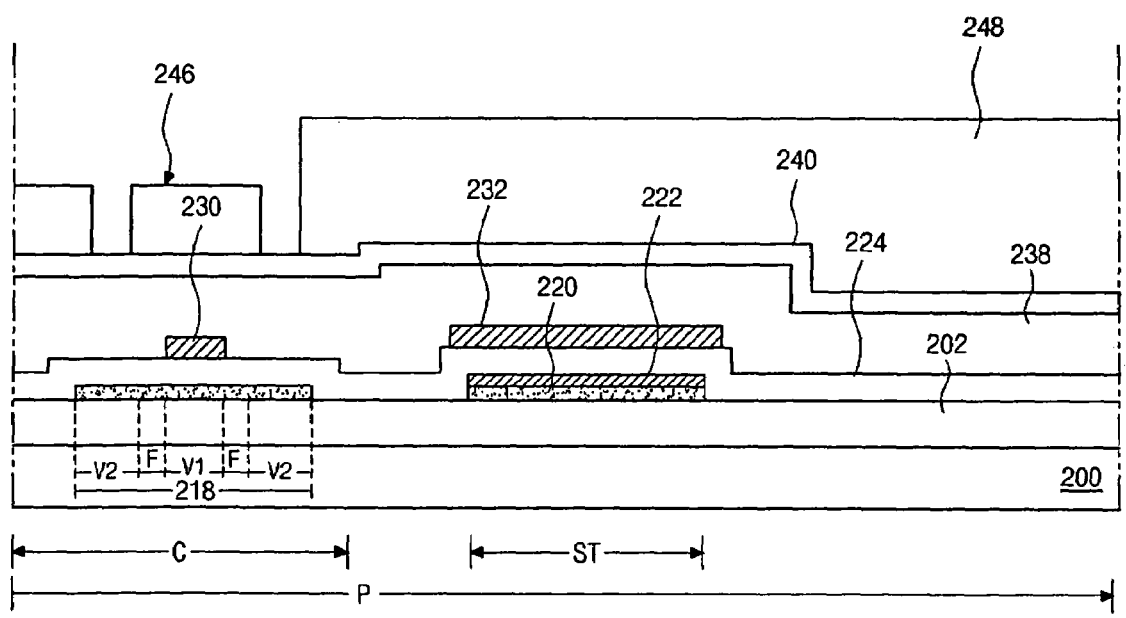

FIGS. 37A and 38A are cross-sectional views of the formation of a photoresist pattern in a driving region of the array substrate during a fourth mask process. FIGS. 37B and 38B are cross-sectional views illustrating the formation of a photoresist pattern in a pixel region of the array substrate during the fourth mask process. Referring to FIGS. 37A and 37B, the ninth photoresist pattern 236 shown in FIGS. 36A and 36B is removed. An inter insulating layer 238 and a transparent conductive layer 240 are sequentially formed on the entire surface of the substrate 200 where p⁺ ion doping is performed. The inter insulating layer 238 is formed of an inorganic insulating material, such as silicon nitride ($SiN_x$) or silicon oxide ($SiO_2$). The transparent conductive layer 240 is formed of a transparent conductive material, such as indium tin oxide (ITO) or indium zinc oxide (IZO).

A photoresist layer 242 is formed on the transparent conductive layer 240 by coating a photoresist material. A mask M2 is disposed over the photoresist layer 242. The mask M2 includes a transmitting portion H1, a blocking portion H2 and a half transmitting portion H3. The transmitting portion H1 corresponds to the doped portions V2 of the first, second and third active patterns 214, 216 and 218. The blocking portion H2 corresponds to the pixel region P, and the half transmitting portion H3 corresponds to the other regions. The photoresist layer 242 is exposed to light through the mask M2 and developed. Accordingly, as illustrated in FIGS. 38A and 38B, tenth and eleventh photoresist patterns 246 and 248 are formed. The tenth photoresist pattern 246 is disposed in the first driving region A, the second driving region B, and the switching region C, and exposes portions of the transparent conductive layer 240 corresponding to the doped portions V2 of the first, second and third active patterns 214, 216 and 218. The eleventh photoresist pattern 248 is disposed in the pixel region P excluding the switching region C. The eleventh photoresist pattern 248 is thicker than the tenth photoresist pattern 246.

Figure 39A:
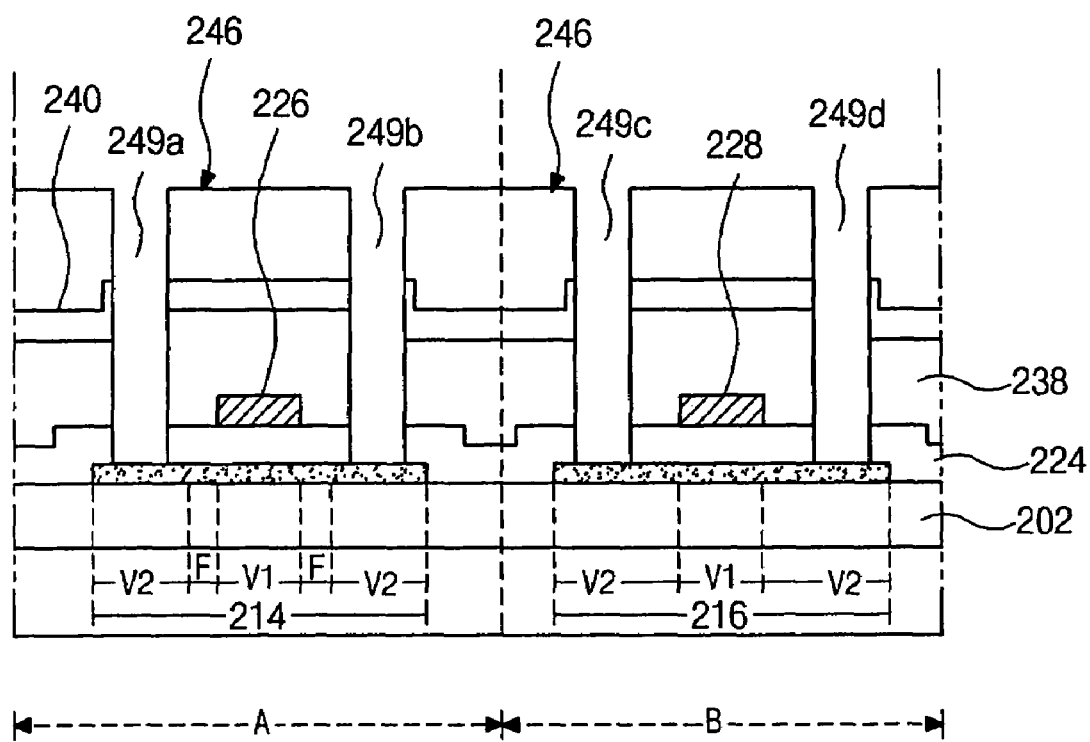
Figure 39B:
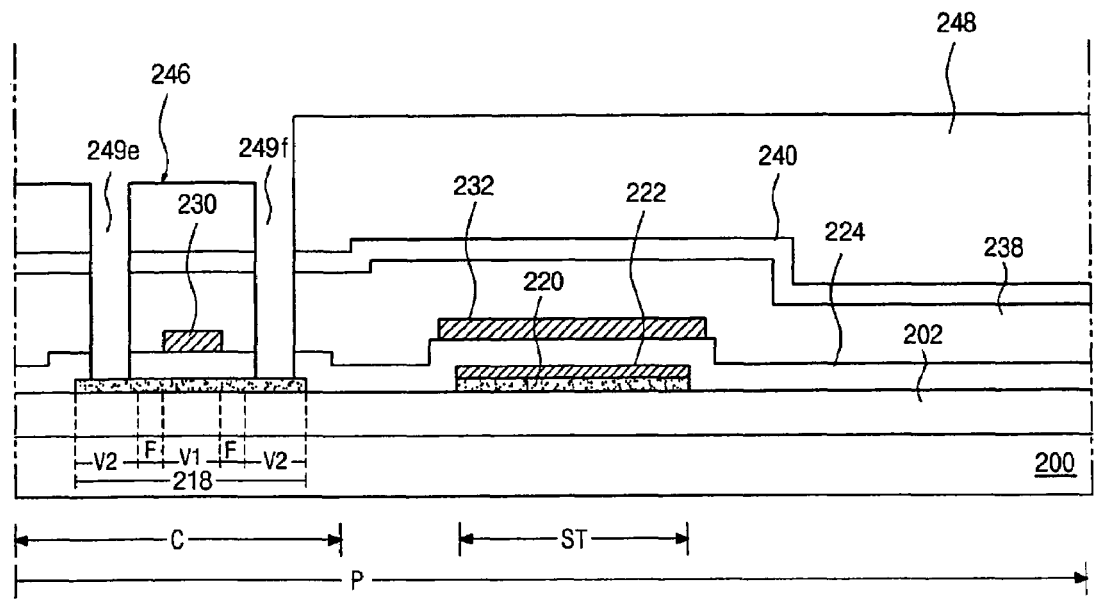

FIG. 39A is a cross-sectional view of the formation of a plurality of contact holes in a driving region of the array substrate during the fourth mask process. FIG. 39B is a cross-sectional view illustrating the formation of a plurality of contact holes in a pixel region of the array substrate during the fourth mask process. Referring to FIGS. 39A and 39B, the exposed transparent conductive layer 240 and the underlying layers, including the inter insulating layer 238 and the gate insulating layer 224, are sequentially removed to thereby form first, second, third, fourth, fifth and sixth contact holes 249a, 249b, 249c, 249d, 249e and 249f exposing the doped portions V2 of the first, second and third active patterns 214, 216 and 218. Although not shown, a contact hole is also formed through the fourth mask process to expose the metal pattern 222.

Figure 40A:
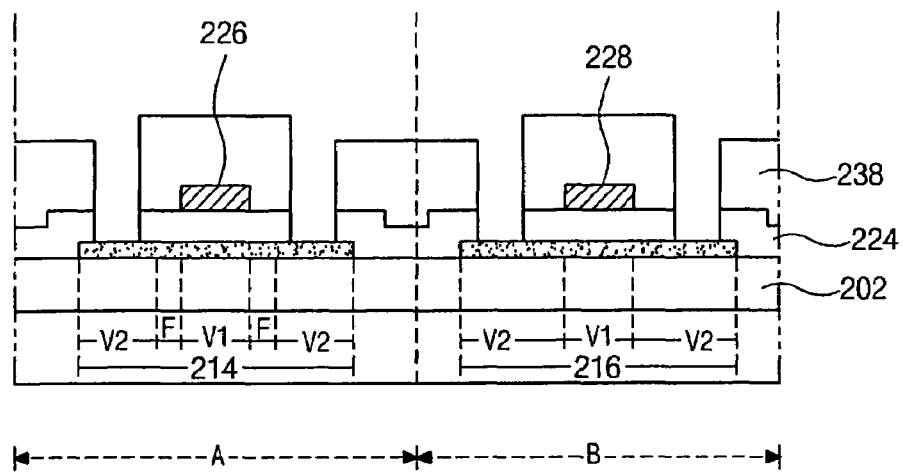
Figure 40B:
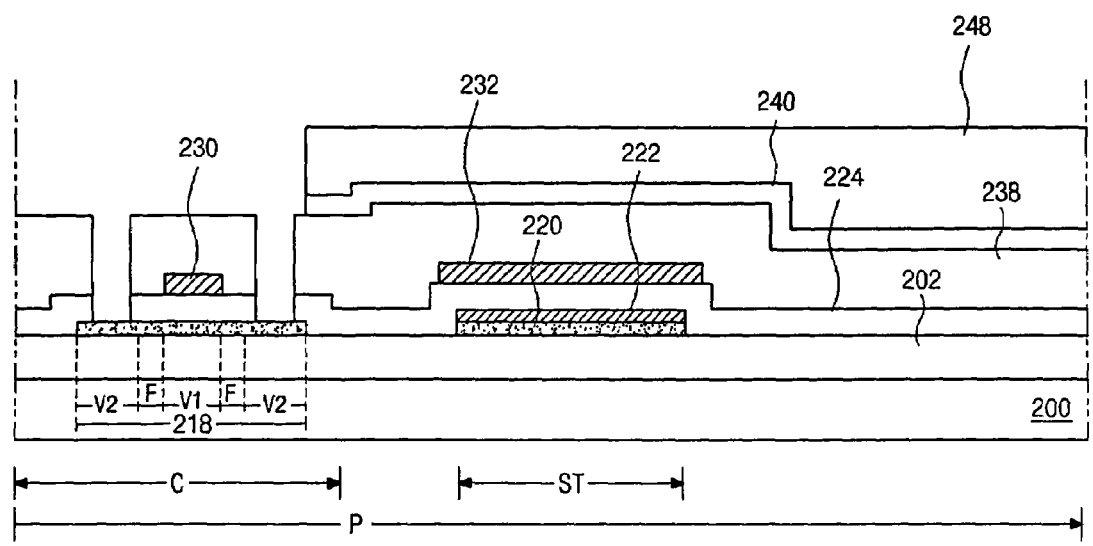

Referring to FIGS. 40A and 40B, the tenth photoresist pattern 246 shown in FIGS. 39A and 39B is removed through an ashing process, and the transparent conductive layer 240 of FIGS. 39A and 39B is exposed in the first driving region A, the second driving region B and the switching region C. At this time, the thickness of the eleventh photoresist pattern 248 is reduced, and an edge of the eleventh photoresist pattern 248 is removed. Next, the exposed transparent conductive layer 240 of FIGS. 39A and 39B is removed to thereby expose the inter insulating layer 238 in the first driving region A, the second driving region B and the switching region C. Then, the eleventh photoresist pattern 248 is removed, and the transparent conductive layer 240 in the pixel region P becomes a pixel electrode 240.

Figure 41A:
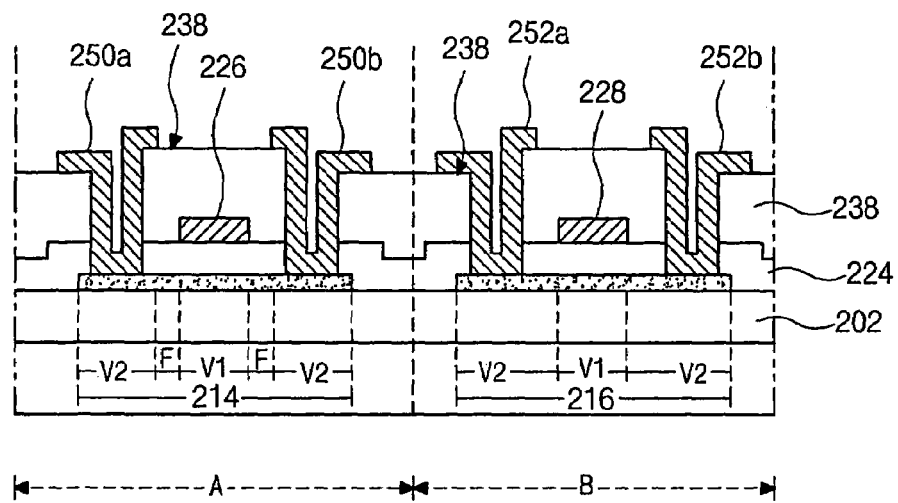
Figure 41B:
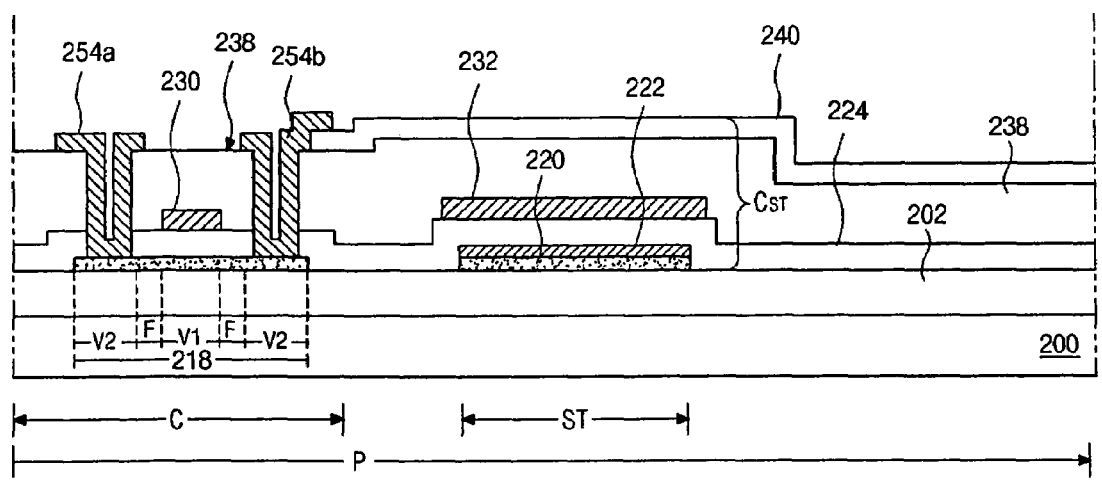

FIG. 41A is a cross-sectional view of the formation of a plurality of electrodes in a driving region of the array substrate during a fifth mask process. FIG. 41B is a cross-sectional view illustrating the formation of a plurality of electrodes in a pixel region of the array substrate during the fifth mask process. Referring to FIGS. 41A and 41B, first source and drain electrodes 250a and 250b, second source and drain electrodes 252a and 252b, and third source and drain electrodes 254a and 254b are formed on the substrate 200 including the pixel electrode 240 thereon by sequentially depositing and patterning a metallic material through a fifth mask process. The metallic material includes chromium (Cr), molybdenum (Mo), tungsten (W), titanium (Ti), aluminum (Al), an aluminum alloy such as AlNd, or copper (Cu). The first source and drain electrodes 250a and 250b contact the doped portions V2 of the first active pattern 214 through the first and second contact holes 249a and 249b. The second source and drain electrodes 252a and 252b contact the doped portions V2 of the second active pattern 216 through the third and fourth contact holes 249c and 249d. The third source and drain electrodes 254a and 254b contact the doped portions V2 of the third active patterns 218 through the fifth and sixth contact holes 249*e* and 249*f*. The third drain electrode 254*b* contacts the pixel electrode 240. Although not shown, the third drain electrode 254*b* also contacts the metal pattern 222. Therefore, the metal pattern 222, the storage line 232 and the pixel electrode 240 function as first, second and third electrodes to form a storage capacitor $C_{ST}$. The storage capacitor $C_{ST}$ includes two parallel capacitors.

According to an other embodiment of the present invention, the array substrate including driver ICs may be manufactured through five-mask processes. Thus, the reduced number of processes lowers occurrence of problems. Manufacturing time is shortened, and manufacturing costs are reduced. Additionally, productivity of the device is improved.

It will be apparent to those skilled in the art that various modifications and variations can be made in the array substrate for liquid crystal display device and the method of manufacturing the same of the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:
    a substrate including a first driving region, a second driving region, and a pixel region, the pixel region including a switching region and a storage region;
    a first n-type transistor in the first driving region, a second p-type transistor in the second driving region;
    a third transistor in the switching region, the third transistor including a gate electrode, an active layer, a source electrode, and a drain electrode;
    an extension portion in the storage region and extending from the active layer the extension portion excluding dopants;
    a metal pattern directly on and contacting the extension portion, wherein an end of the metal pattern is aligned with an end of the extension portion;
    a storage line over the metal pattern; and
    a pixel electrode in the pixel region and contacting the third transistor
        wherein the drain electrode of the third transistor partially covers and contacts an end of the pixel electrode.

2. The array substrate according to claim 1, wherein the metal pattern, the storage line and the pixel electrode form first, second and third electrodes of a storage capacitor, and wherein the storage capacitor includes a first capacitor and a second capacitor, the first capacitor parallel to the second capacitor.

3. The array substrate according to claim 2, wherein the first capacitor is formed by the metal pattern and the storage line, and the second capacitor is formed by the storage line and the pixel electrode.

4. The array substrate according to claim 1, further comprising a gate line connected to the gate electrode and a data line connected to the source electrode.

5. The array substrate according to claim 1, wherein the active layer and the extension portion include polycrystalline silicon.

6. The array substrate according to claim 1, wherein the drain electrode electrically contacts the metal pattern and the pixel electrode.

7. The array substrate according to claim 1, wherein the first n-type transistor and the third transistor in the switching region have substantially the same structure.

* * * * *